(12) United States Patent
Vanfleteren et al.

(10) Patent No.: US 9,247,648 B2
(45) Date of Patent: Jan. 26, 2016

(54) STRETCHABLE ELECTRONIC DEVICE

(75) Inventors: Jan Vanfleteren, Gentbrugge (BE); Frederick Bossuyt, Harelbeke (BE); Fabrice Axisa, Sacierges-Saint-Martin (FR)

(73) Assignees: IMEC, Leuven (BE); Univesiteit Gent, Ghent (BE)

( * ) Notice: Subject to any disclaimer, the term of this patent is extended or adjusted under 35 U.S.C. 154(b) by 573 days.

(21) Appl. No.: 13/193,551

(22) Filed: Jul. 28, 2011

(65) Prior Publication Data
US 2012/0051005 A1 Mar. 1, 2012

Related U.S. Application Data

(63) Continuation of application No. PCT/EP2010/051108, filed on Jan. 29, 2010.

(60) Provisional application No. 61/148,886, filed on Jan. 30, 2009.

(51) Int. Cl.
*H05K 1/00* (2006.01)
*H05K 1/18* (2006.01)
(Continued)

(52) U.S. Cl.
CPC .............. *H05K 1/186* (2013.01); *H01L 21/565* (2013.01); *H01L 21/6835* (2013.01); *H01L 23/3142* (2013.01); *H01L 23/4985* (2013.01); *H01L 24/81* (2013.01); *H05K 1/0283* (2013.01); *H01L 24/16* (2013.01); *H01L 2221/68345* (2013.01); *H01L 2224/81001* (2013.01); *H01L 2224/81801* (2013.01); *H01L 2924/014* (2013.01); *H01L 2924/01005* (2013.01);
(Continued)

(58) Field of Classification Search
USPC .................................. 361/749, 691.1; 439/32
See application file for complete search history.

(56) References Cited

U.S. PATENT DOCUMENTS 7,265,298 B2    9/2007  Maghribi et al.
7,282,934 B2 *  10/2007  Mazza et al. .............. 324/754.11
(Continued)

FOREIGN PATENT DOCUMENTS

DE    4412278 A1    10/1995
NL    9000279 A     9/1991

OTHER PUBLICATIONS

K.L. Lin et al., "Design and fabrication of stretchable multilayer self-aligned interconnects for flexible electronics and large-area sensor arrays using excimer laser photoablation", IEEE Electron Device Letters, vol. 30, No. 1, 2009.
(Continued)

*Primary Examiner* — Andargie M Aychillhum
(74) *Attorney, Agent, or Firm* — Knobbe, Martens, Olson & Bear LLP

(57) ABSTRACT

A stretchable electronic device is disclosed. In one aspect, the device has a stretchable interconnection electrically connecting two electronic components. The stretchable interconnection includes an electrically conductive channel having a predetermined first geometry by which the channel is stretchable up to a given elastic limit and a first flexible supporting layer provided for supporting the electrically conductive channel and having a predetermined second geometry by which the first supporting layer is stretchable. The predetermined second geometry has a predetermined deviation from the predetermined first geometry chosen for restricting stretchability of the electrically conductive channel below its elastic limit.

20 Claims, 23 Drawing Sheets

(51) Int. Cl.
  *H01L 21/56* (2006.01)
  *H01L 21/683* (2006.01)
  *H01L 23/31* (2006.01)
  *H01L 23/498* (2006.01)
  *H05K 1/02* (2006.01)
  *H01L 23/00* (2006.01)
  *H05K 3/00* (2006.01)
  *H05K 3/06* (2006.01)
  *H05K 3/20* (2006.01)
  *H05K 3/28* (2006.01)
  *H05K 3/34* (2006.01)

(52) U.S. Cl.
  CPC .......... *H01L 2924/0105* (2013.01); *H01L 2924/01006* (2013.01); *H01L 2924/01013* (2013.01); *H01L 2924/01019* (2013.01); *H01L 2924/01029* (2013.01); *H01L 2924/01033* (2013.01); *H01L 2924/01047* (2013.01); *H01L 2924/01072* (2013.01); *H01L 2924/01073* (2013.01); *H01L 2924/01075* (2013.01); *H01L 2924/01076* (2013.01); *H01L 2924/01078* (2013.01); *H01L 2924/01079* (2013.01); *H01L 2924/01082* (2013.01); *H05K 1/189* (2013.01); *H05K 3/007* (2013.01); *H05K 3/06* (2013.01); *H05K 3/20* (2013.01); *H05K 3/284* (2013.01); *H05K 3/3436* (2013.01); *H05K 2201/0133* (2013.01); *H05K 2201/0355* (2013.01); *H05K 2201/09118* (2013.01); *H05K 2201/09263* (2013.01); *H05K 2203/016* (2013.01); *H05K 2203/0271* (2013.01); *H05K 2203/1316* (2013.01); *Y10T 29/49169* (2015.01)

(56) References Cited

U.S. PATENT DOCUMENTS

| | | | |
|---|---|---|---|
| 7,487,587 | B2 | 2/2009 | Vanfleteren et al. |
| 2002/0094701 | A1* | 7/2002 | Biegelsen et al. ............ 439/32 |
| 2004/0129077 | A1 | 7/2004 | Franz et al. |
| 2004/0238819 | A1 | 12/2004 | Maghribi et al. |
| 2004/0243204 | A1* | 12/2004 | Maghribi et al. ......... 607/115 |
| 2006/0056161 | A1* | 3/2006 | Shin et al. ................. 361/749 |
| 2008/0026138 | A1 | 1/2008 | Maghribi et al. |
| 2008/0257586 | A1 | 10/2008 | Chen et al. |

OTHER PUBLICATIONS

International Search Report for International Application No. PCT/EP2010/051108 dated Jul. 5, 2010 by European Patent Office.

* cited by examiner

4(l)

4(m)

4(n)

Figure 4
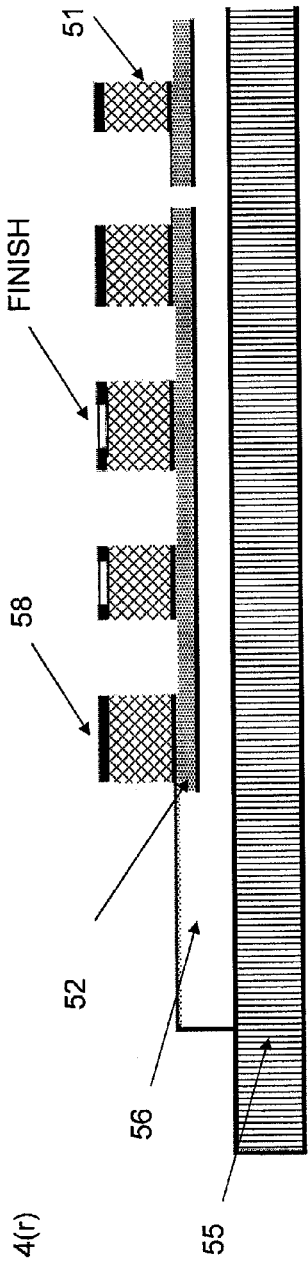
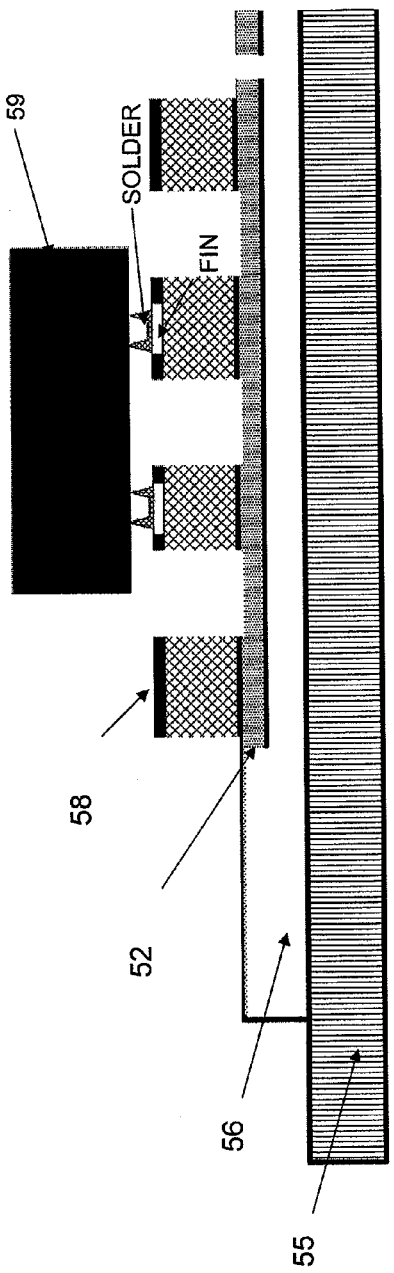
4(r) Figure 4(i) in detail
4(s) Figure 4(j) in detail

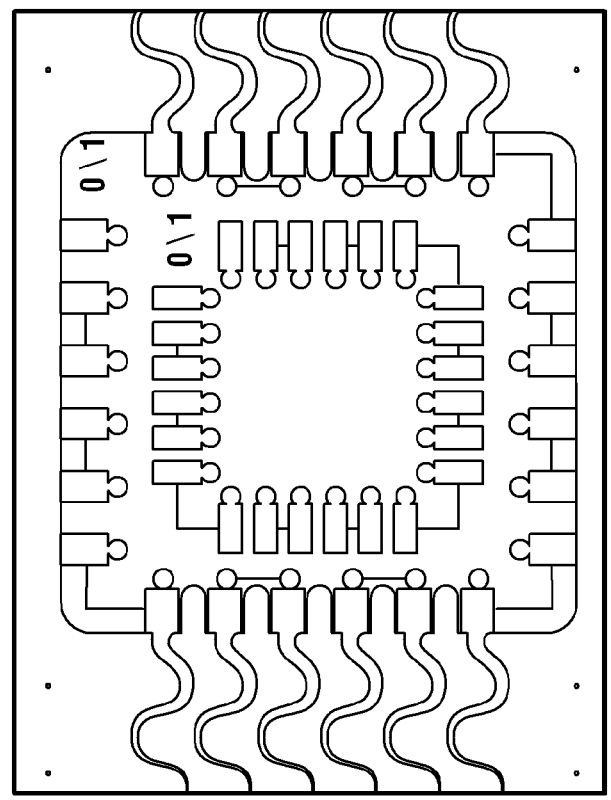
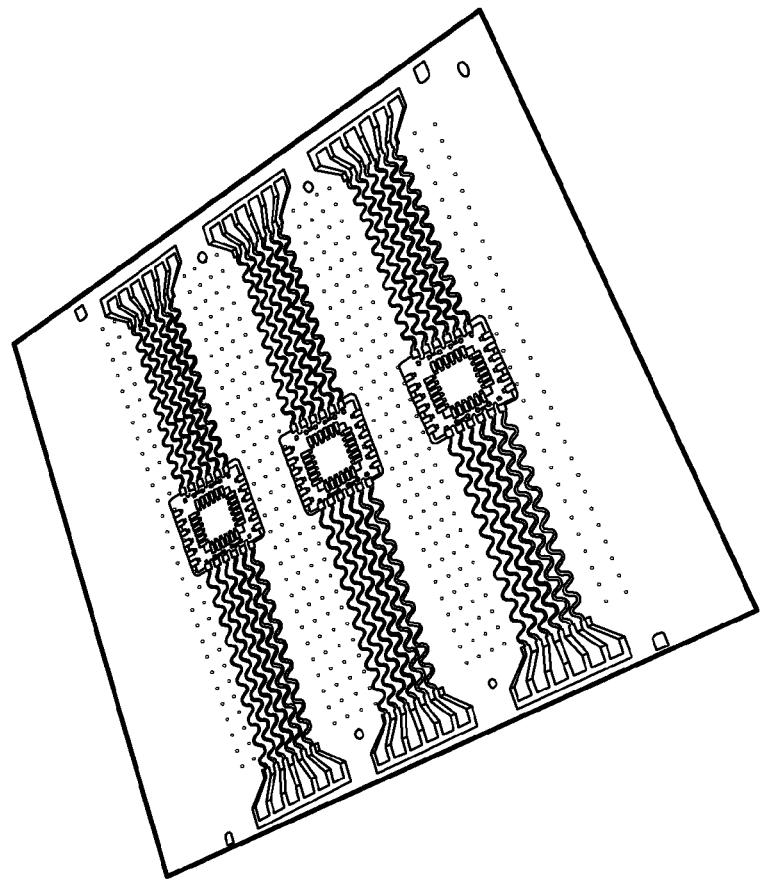
FIG. 9

Figure 15
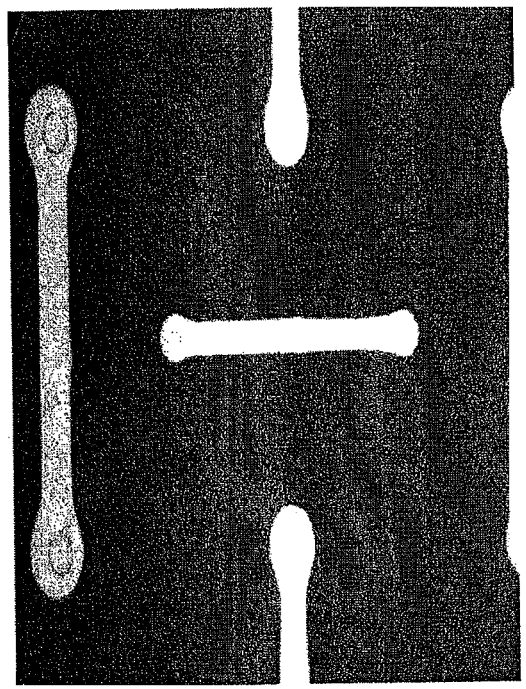
15(b)
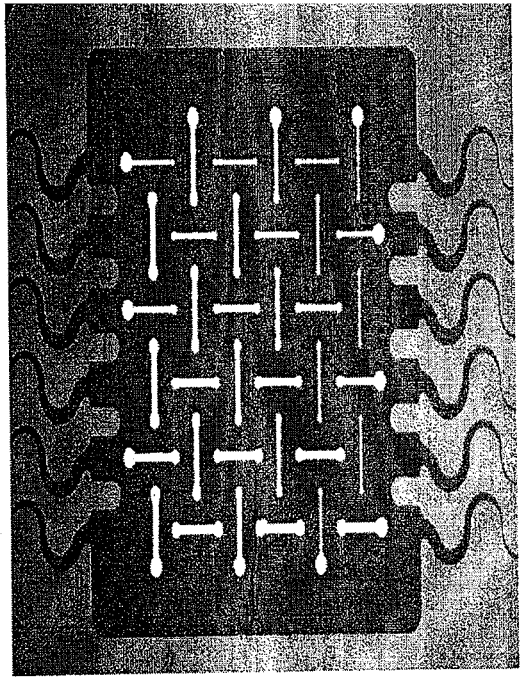
15(a)

STRETCHABLE ELECTRONIC DEVICE

CROSS REFERENCE TO RELATED APPLICATIONS

This application is a continuation of PCT Application No. PCT/EP2010/051108, filed Jan. 29, 2010, which claims priority under 35 U.S.C. §119(e) to U.S. provisional patent application 61/148,886 filed on Jan. 30, 2009. Each of the above applications is incorporated herein by reference in its entirety.

BACKGROUND OF THE INVENTION

1. Field of the Invention

The disclosed technology relates to a stretchable electronic device comprising a stretchable interconnection electrically connecting two electronic components of the device, and further relates to a method of making such stretchable electronic device.

2. Description of the Related Technology

It is known to build electronic circuits on flexible substrates such as plastic substrates. Flexible circuits are often used in applications where flexibility, space savings, or production constraints limit the use of rigid circuit boards.

It is further known to connect electronic devices with the aid of stretchable interconnections. Such stretchable interconnections allow for relative movement of the electronic devices with respect to each other.

Maghribi et al (US2004/0243204, US2008/0026138, U.S. Pat. No. 7,265,298) describe a stretchable electronic apparatus and a method of producing the apparatus. The apparatus comprises a stretchable polymer body, and at least one circuit line extending in the longitudinal direction and having a longitudinal component that extends in the longitudinal direction, and at the same time an offset component that is at an angle to the longitudinal direction. The metal features are patterned (deposited) on the stretchable polymer body. Serpentine circuits are used in the electronic circuit.

Franz et al (US2004/0129077) describe a system comprising an overload protection to limit the deflection of a spring system. The sensor is implemented in a micromechanical structural component and has parts which are movable in relation to the stationary substrate of the structural component. It includes an unsupported seismic mass, a spring system having at least one spring, the seismic mass being connected to the substrate through the spring system, an overload protection to limit the deflection of the spring system and the seismic mass in at least one direction, and means for detecting the deflections of the spring system and the seismic mass. Design measures are proposed whereby the impact forces may be reduced to prevent conchoidal breaks and resulting incipient damage to the sensor structure as well as formation of particles. To that end, at least one two-dimensional stop for at least one moving part of the sensor structure is provided as overload protection. Alternatively or in addition thereto, at least one spring stop for at least one moving part of the sensor structure is provided as overload protection.

In "Design and fabrication of stretchable multilayer self-aligned interconnects for flexible electronics and large-area sensor arrays using excimer laser photoablation", IEEE Electron Device Letters, Vol 30, No. 1, 2009, K. L. Lin et al describe a fabrication process for stretchable multilayer interconnects on polymer substrates wherein metal patterns are used both as functional interconnect layers and as in situ masks for polymer excimer laser photoablation. This fabrication process is based on a sequential build-up approach. The process starts from a polyimide sheet onto which a metal is deposited. The metal is patterned and another layer of polyimide is applied by spincoating. A second metal layer can then be applied and patterned. The metal is used as a mask during the laser ablation of the underlying polyimide layer. In this way, free standing stretchable interconnections are created. This approach, that is based on removing excess material (by laser ablation) to obtain a stretchable structure, may lead to a time consuming, material consuming and non cost-effective fabrication process. Integration of electrical components with the free standing stretchable interconnections is not discussed.

In U.S. Pat. No. 7,487,587 a method for the fabrication of stretchable electronic circuits is described, using an alternative approach. In a first process patterned metal features are formed on a sacrificial (temporary) substrate. Next components are mounted and then a stretchable and/or flexible material is provided for embedding the patterned metal features and the components. After that the sacrificial substrate is removed. Optionally a second set of components can be mounted at the side where the sacrificial substrate is removed and this second set of components can be covered with a stretchable and/or flexible material. It is an advantage of this approach that the components are provided in an early stage of the process, such that they can be soldered. However, this approach only allows single level metallization. For conductor crossovers one needs to provide zero Ohm cross-over resistors in the stretchable circuit part.

SUMMARY OF CERTAIN INVENTIVE ASPECTS

Certain inventive aspects relate to a stretchable electronic device comprising at least one stretchable interconnection of which the stretchability is controlled in an alternative way.

In one aspect, the stretchable interconnection comprises a first electrically conductive channel having a predetermined first geometry by which the channel is stretchable up to a given elastic limit and a first flexible supporting layer for supporting the first electrically conductive channel and having a predetermined second geometry by which the first supporting layer is stretchable. The predetermined second geometry of the first flexible supporting layer has a predetermined first deviation from the predetermined first geometry of the first electrically conductive channel, chosen for restricting stretchability of the first electrically conductive channel below its elastic limit.

Certain inventive aspects relate to a stretchable electronic device comprising crossing stretchable interconnections of which the stretchability is controlled and wherein the need for using zero-ohm cross-over resistors is avoided.

The stretchable electronic device may comprise a double layer or double level stretchable interconnection, wherein the double level stretchable interconnection comprises a first stretchable interconnection comprising a first electrically conductive channel and a second stretchable interconnection comprising a second electrically conductive channel crossing the first electrically conductive channel, wherein the first electrically conductive channel and the second electrically conductive channel are separated (electrically isolated) by a flexible electrically insulating layer, e.g. the first flexible supporting layer.

In one aspect, a double level stretchable interconnection comprises a first conductor layer and a second conductor layer, wherein at predetermined locations an electrical contact is provided between the first conductor layer and the second conductor layer through the flexible electrically insulating layer. The second electrically conductive channel has a predetermined third geometry by which the channel is stretchable up to a given elastic limit and the first flexible supporting layer provided for supporting the second electrically conductive channel has a predetermined fourth geometry by which the first supporting layer is stretchable. The predetermined fourth geometry of the first flexible supporting layer has a second predetermined deviation from the predetermined third geometry of the second electrically conductive channel, chosen for restricting the stretchability of the second electrically conductive channel below its elastic limit. The second electrically conductive channel can be formed partially in the first conductor layer and partially in the second conductor layer.

With the known stretchable electronic devices, the electrically conductive channel and the flexible supporting layer are patterned in a way that a stretchable interconnection is created. The patterning of the electrically conductive channel is the same as that of the flexible supporting layer. An analysis of such a prior art electronic device, showed that such devices have the disadvantage that the stretchable interconnection may break upon stretching the structure to a too high extent.

In one aspect, the patterning of the electrically conductive channels and the first flexible supporting layer of the electronic device differ. In particular, the predetermined second geometry of the first flexible supporting layer has a predetermined first deviation from the predetermined first geometry of the first electrically conductive channel chosen to restrict the stretchability of the first electrically conductive channel below its elastic limit. As a result, the first flexible supporting layer of the electronic device may be able to control and/or limit the stretchability of the first electrically conductive channel and is able to reduce the risk of overstretching and breaking of the first electrically conductive channel. In this way, the lifetime of the first electrically conductive channel and of the entire electronic device can be increased.

In embodiments with a double level stretchable interconnection comprising a first electrically conductive channel and a second electrically conductive channel, the predetermined fourth geometry of the first flexible supporting layer has a second predetermined deviation from the predetermined third geometry of the second electrically conductive channel chosen to restrict the stretchability of the second electrically conductive channel. As a result, the first flexible supporting layer of the electronic device may be able to control and/or limit the stretchability of the first electrically conductive channel and of the second electrically conductive channel and is able to reduce the risk of overstretching and breaking of the first electrically conductive channel and of the second electrically conductive channel. In this way, the lifetime of the first and second electrically conductive channel and of the entire electronic device can be increased.

The predetermined deviations can take any form considered suitable by the person skilled in the art. At least part of the predetermined second geometry of the first flexible supporting layer can for instance, but not being limited thereto, be made wider than the predetermined first geometry of the first electrically conductive channel, thereby limiting the stretching of the first electrically conductive channel. At least part of the predetermined fourth geometry of the first flexible supporting layer can for instance, but not being limited thereto, be made wider than the predetermined third geometry of the second electrically conductive channel, thereby limiting the stretching of the second electrically conductive channel. By making at least part of the first flexible supporting layer wider than the electrically conductive channels, a stretch limiter/controller is introduced limiting/controlling the stretchability of the electrically conductive channels and reducing the risk of cracks.

The predetermined deviations of the first flexible supporting layer can be present along the entire length of the first and/or second electrically conductive channel or only at certain areas of the first and/or second electrically conductive channel. Introducing the predetermined deviations only at certain areas of the first and/or second electrically conductive channel may result in a substantial material reduction.

In case the first predetermined deviation takes the form of an increased width of the second geometry of the first flexible supporting layer, the width of the predetermined second geometry of the first flexible supporting layer can be made larger than the width of the predetermined first geometry of the first electrically conductive channel along the entire length of the first electrically conductive channel or only along part of its length. The width of the predetermined second geometry may vary or remain constant along its length.

In case the predetermined second deviation takes the form of an increased width of the fourth geometry of the first flexible supporting layer, the width of the predetermined fourth geometry of the first flexible supporting layer can be made larger than the width of the predetermined third geometry of the second electrically conductive channel along the entire length of the second electrically conductive channel or only along part of its length. The width of the predetermined fourth geometry may vary or remain constant along its length.

In one aspect, the predetermined deviations are at least present at stress sensitive parts of the electrically conductive channels, i.e. parts of the electrically conductive channels which have a higher risk to cracks than the remaining parts. By introducing the predetermined deviations at these locations, the stretch limiter/controller is able to limit/control the risk of cracks in those areas which are most likely to break.

The reliability of the soldering connections between the electrically conductive channels and the electronic components of the electronic device can be improved by supporting both the components and the conductive channels with a flexible material. Thereto, the first flexible supporting layer preferably comprises a support part at an end of a stretchable interconnection for supporting at least one of the electronic components. In this way, flexible islands are created under the components and less stresses are exerted on the soldered interconnects because of the supporting layer, shifting the stresses during stretching to the border of the flexible supporting layer.

In one aspect, the stretchable electronic device comprises a layer of stretchable material in which the stretchable electronic device is embedded. The layer of stretchable material provides the device with an additional support.

The first electrically conductive channel and/or the second electrically conductive channel can be made of one or more layers. Preferably, the first and/or second electrically conductive channel comprises a first electrically conductive layer and a second electrically conductive layer, provided on top of each other. Such a double layered electrically conductive channel may increase the lifetime of the electrically conductive channel and of the entire electronic device in the following way. The second electrically conductive layer may be made of a second material which is less brittle and thus has a smaller risk of breaking under stress than the first electrically conductive layer. As a result, in case the first electrically conductive layer would break at certain weak stress sensitive points, the second electrically conductive layer forms a bridge over the cracks electrically connecting the disconnected points of the first electrically conductive layer. This has the advantage that an optimal conductive material can be chosen for the first electrically conductive layer, such as for example copper, even though it may be more brittle and prone to cracking with respect to other conductive materials. The first flexible supporting layer is a first measure which reduces the risk of cracks in the first electrically conductive layer. When a crack does occur, the second electrically conductive layer, made in a less brittle conductive material, can ensure that there is still a conductive connection over the crack.

The first flexible supporting layer can be located under or above the first electrically conductive channel. Preferably, a first and a second flexible supporting layer are provided on opposite sides of the first electrically conductive channel, increasing the reliability of the electronic device. The second flexible supporting layer is preferably patterned in a predetermined fifth geometry by which it is stretchable, which is preferably equal to the second geometry of the first flexible supporting layer, but may also differ therefrom.

One inventive aspect relates to a method for manufacturing an electronic device described above.

A method for manufacturing an electronic device as described above may comprise: providing a conductor sheet or first conductor layer made from an electrically conductive material; providing a first patterned flexible supporting layer on the conductor sheet; patterning the conductor sheet to form the first electrically conductive channel of the device; and mounting the components to the first electrically conductive channel.

The method may further comprise providing a second patterned flexible supporting layer on the conductor sheet at a side opposite to the side of the first patterned flexible supporting layer. The second patterned flexible supporting layer may be provided before mounting the electronic components.

In one aspect, the method may further comprise providing a second electrically conductive channel crossing the first electrically conductive channel, wherein providing a second electrically conductive channel comprises providing a patterned second conductor layer over the first patterned flexible supporting layer before patterning the conductor sheet, thereby forming cross-overs over the first electrically conductive channel. In such embodiments the first patterned supporting layer is preferably an electrically insulating layer.

The method may further comprise providing vias through the first flexible supporting layer and providing an electrical connection between the first conductor layer and the second conductor layer through the vias.

The method may further comprise mounting electronic components to the second electrically conductive channel.

The method may further comprise bonding the structure comprising the conductor sheet and the first patterned flexible supporting layer to a carrier, preferably a rigid carrier, before patterning the conductor sheet, with the side comprising the first patterned flexible supporting layer facing the carrier. Bonding may for example be done by means of a temporary adhesive. In one aspect wherein a second conductor layer is provided, bonding is done after providing the second conductor layer, with the side comprising the second conductor layer facing the carrier. Preferably the supporting carrier is a rigid carrier.

In one aspect the first electrically conductive channel and/or the second electrically conductive channel may have a meandering shape.

Mounting the electronic components to the first electrically conductive channel and/or to the second electrically conductive channel may be done by soldering.

The method may further comprise embedding the stretchable electronic device in a stretchable material.

It is an advantage of a method according to one aspect that it is a time effective and cost effective method, wherein the need for removing excessive material (e.g. by laser ablation) is strongly reduced as compared to prior art solutions, thus minimizing the amount of material waste. It is an advantage of a method according to one aspect that a significant part of the fabrication process can be performed on a rigid (temporary) carrier. It is an advantage that all process steps and techniques are standard techniques, such as for example PCB (Printed Circuit Board) manufacturing techniques. It is an advantage of a method according to one aspect that electronic components can be soldered.

It is an advantage of stretchable circuits with double level electrical interconnections that more compact and more complex stretchable electronic circuits can be made as compared to stretchable circuits with single level electrical interconnections. Double level electrically conductive channels or conductors, e.g. meandered electrically conductive channels, can lead to an increased density of stretchable conductors. It is an advantage that routing of electrically conductive channels is facilitated because two conductive layers are available. Crossing conductive meanders can be made when they are defined in two different conductor levels, thereby eliminating or substantially reducing the need for providing zero-ohm cross-over resistors. This is in particular useful for e.g. wearable signage applications, where a matrix of LEDs (Light Emitting Devices) makes up a stretchable display, and where the LED matrix is driven by a set of crossing conductors. In this case, double level electrical interconnections lead to a reduction of the number of components by roughly a factor of two, because the need for providing zero-ohm cross-over resistors is avoided.

BRIEF DESCRIPTION OF THE DRAWINGS

The invention will be further elucidated below, referring to FIGS. 1 to 16.

FIG. 9 shows a polyimide supported substrate with copper patterns after lithography and etching.

FIG. 15 shows photographs illustrating the second conductor layer being separated by a flexible supporting layer from the copper sheet and being in contact with the copper sheet through vias.

DETAILED DESCRIPTION OF CERTAIN ILLUSTRATIVE EMBODIMENTS

Definitions

With "rigid" as used in this application is meant stiff, unyielding, i.e. a rigid structure is not adapted to be deformable during normal use of the structure.

With "flexible" as used in this application is meant non-stiff, non-rigid, i.e. bendable but not stretchable. A flexible structure is adapted to be deformable in a certain direction during normal use of the structure, but does not elongate. The length does not change during bending.

With "stretchable" as used in this application is meant resilient, i.e. elastically deformable with elongation. A stretchable structure is adapted to be elastically deformed during normal use (with elongation). A stretchable structure can be made out of non-stretchable bulk materials, such as flexible materials or even rigid materials. An example is a metallic spring. The metal in itself is a rigid bulk material but the shaping of the material leads to a certain degree of flexibility and even a certain degree of stretchability.

With "elastic limit" of a material/structure is meant the stress at which the material/structure begins to deform plastically. Prior to the elastic limit point the material/structure will deform elastically and will return to its original shape when an applied stress is removed. Once the elastic limit point is passed, some fraction of the deformation will be permanent and non-reversible.

Certain embodiments relate to a stretchable electronic device comprising a stretchable interconnection electrically connecting two electronic components of the device, the stretchable interconnection comprising an electrically conductive channel having a predetermined first geometry by which the channel is stretchable up to a given elastic limit and a first flexible supporting layer provided for supporting the electrically conductive channel and having a predetermined second geometry by which the first supporting layer is stretchable. The stretchable electronic device may comprise two or more crossing stretchable interconnections. Certain embodiments further relate to a method of making such stretchable electronic devices.

Figure 1:
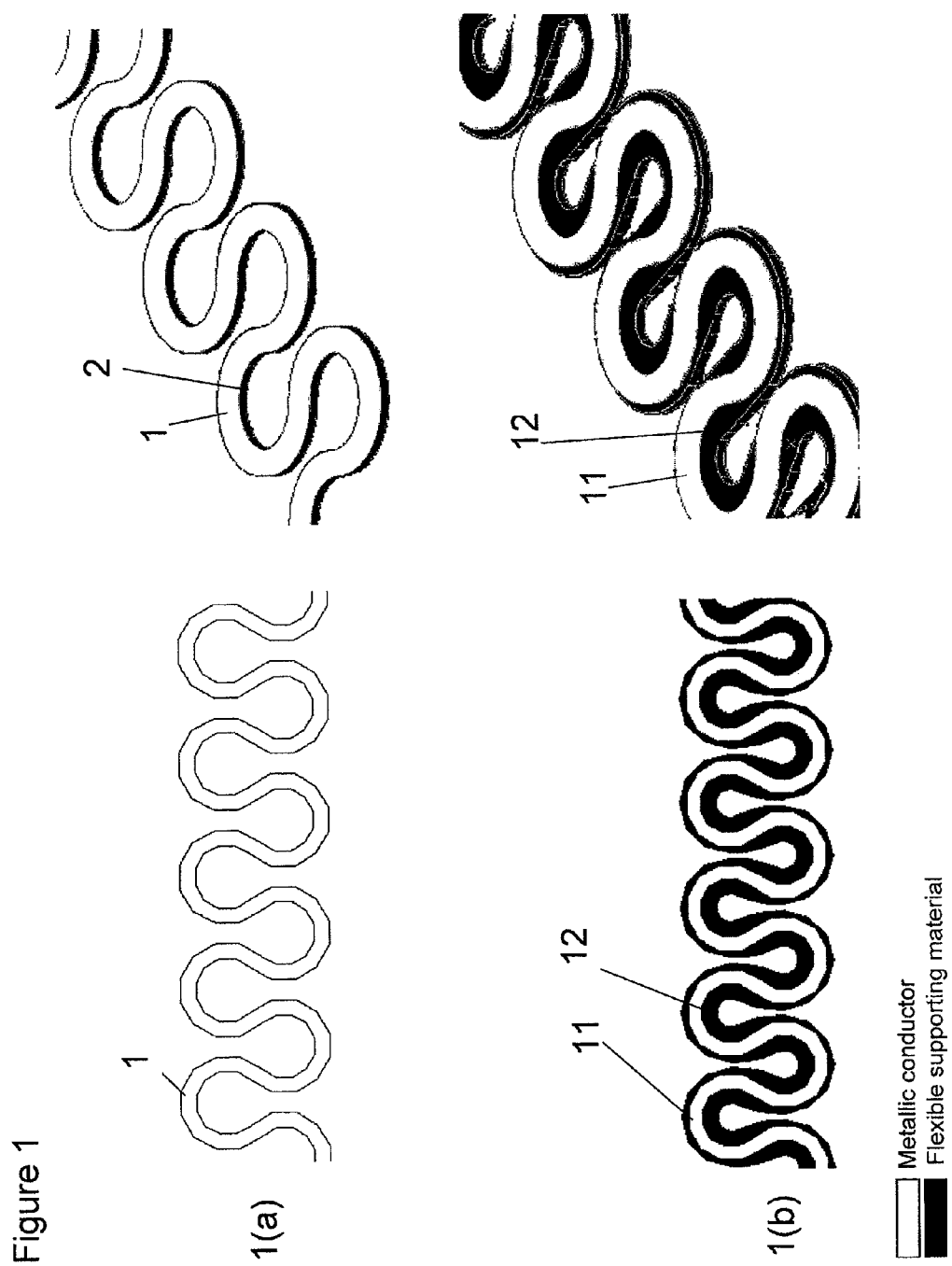
FIG. 1(a) shows a top view and a side view of a meander-shaped electrically conductive channel supported by a flexible supporting layer according to the state of the art.
FIG. 1(b) shows a top view and a side view of a meander shaped electrically conductive channel supported by a flexible supporting layer such that a stretch-stop is introduced according to certain embodiments.

FIGS. 1(a), 2(a) and 2(b) show a top view and a side view of a stretchable interconnection according to the state of the art. In FIG. 2(a) a stretchable meander shaped electrically conductive channel 1 is shown, embedded in a soft stretchable material 3 like e.g. PDMS, polyurethanes, . . . and provided for connecting different electronic components with each other. Such a stretchable interconnection shows low reliability towards stretching. The difference in mechanical properties occurring at the interface of the metal conductors 1 and the stretchable material 3 under stretch is high, leading to an easy breaking of the metal conductors. Also, on places where no stretch may happen, e.g. on locations with components, the reliability is low because of high stresses on the (for example soldered) connections during stretching. The transition between the rigid components and the stretchable interconnections is abrupt, and may lead to a malfunctioning of the electronic circuit. In FIGS. 1(a) and 2(b) a stretchable interconnection is shown comprising an electrically conductive channel 1 and a first flexible supporting layer 2 provided for supporting the electrically conductive channel. The interconnection is meander shaped for forming a stretchable interconnection. The meander shapes of the electrically conductive channel and the first flexible supporting layer are the same and completely overlap. An analysis of such a prior art stretchable interconnection showed that such interconnections may break upon stretching the structure to a too high degree, especially at stress sensitive parts of the electrically conductive channel, i.e. at the bending of the meander shapes.

To increase the lifetime of the stretchable interconnection, the concept of a stretch stop or stretch limiter according to one embodiment is introduced as shown in FIGS. 1(b) and 2(c). Thereto, the first electrically conductive channel 11 has a first meandering shape, being defined by a first angle with respect to a 0°-baseline, a first width and a first diameter, defining the predetermined first geometry by which the channel is stretchable up to a given elastic limit. The first flexible supporting layer 12 supporting the first electrically conductive channel has a second meandering shape being defined by a second angle with respect to a 0°-baseline, a second width and a second diameter, defining the predetermined second geometry. The second width of the meandering shape of the first flexible supporting layer is larger than the first width of the meandering shape of the first electrically conductive channel, as is shown in FIG. 1(b), restricting the stretchability of the first electrically conductive channel below its elastic limit. The second width of the meandering shape of the first flexible supporting layer has an increased width at the bending of the meandering shape of the first electrically conductive channel, i.e. at the stress-sensitive parts of the meandering shape of the first electrically conductive channel.

Alternative ways of creating a stretch limiter for meander shaped electrically conductive channels 21, 31 by increasing the width of the meandering shape of the first flexible supporting layer are shown in FIGS. 3(e) and 3(f). In FIG. 3(e) the second width of the meandering shape of the first flexible supporting layer 22 is constant along its length, while in FIG. 3(f) the width of the meandering shape of the first flexible supporting layer 32 at the bending of the meandering shape of the first electrically conductive channel is higher compared to the other parts of the meandering shape.

In general, a stretch stop/limiter may be introduced for these meandering shaped electrically conductive channels, by suitably varying at least one of the second angle, second width or second diameter of the meandering shape of the first flexible supporting layer with respect to respectively the first angle, first width or first diameter of the meander shape of the electrically conductive channel. The second angle/diameter of the meandering shape of the first flexible supporting layer may for instance be higher than the first angle/diameter of the meandering shape of the electrically conductive channel.

Figure 3:
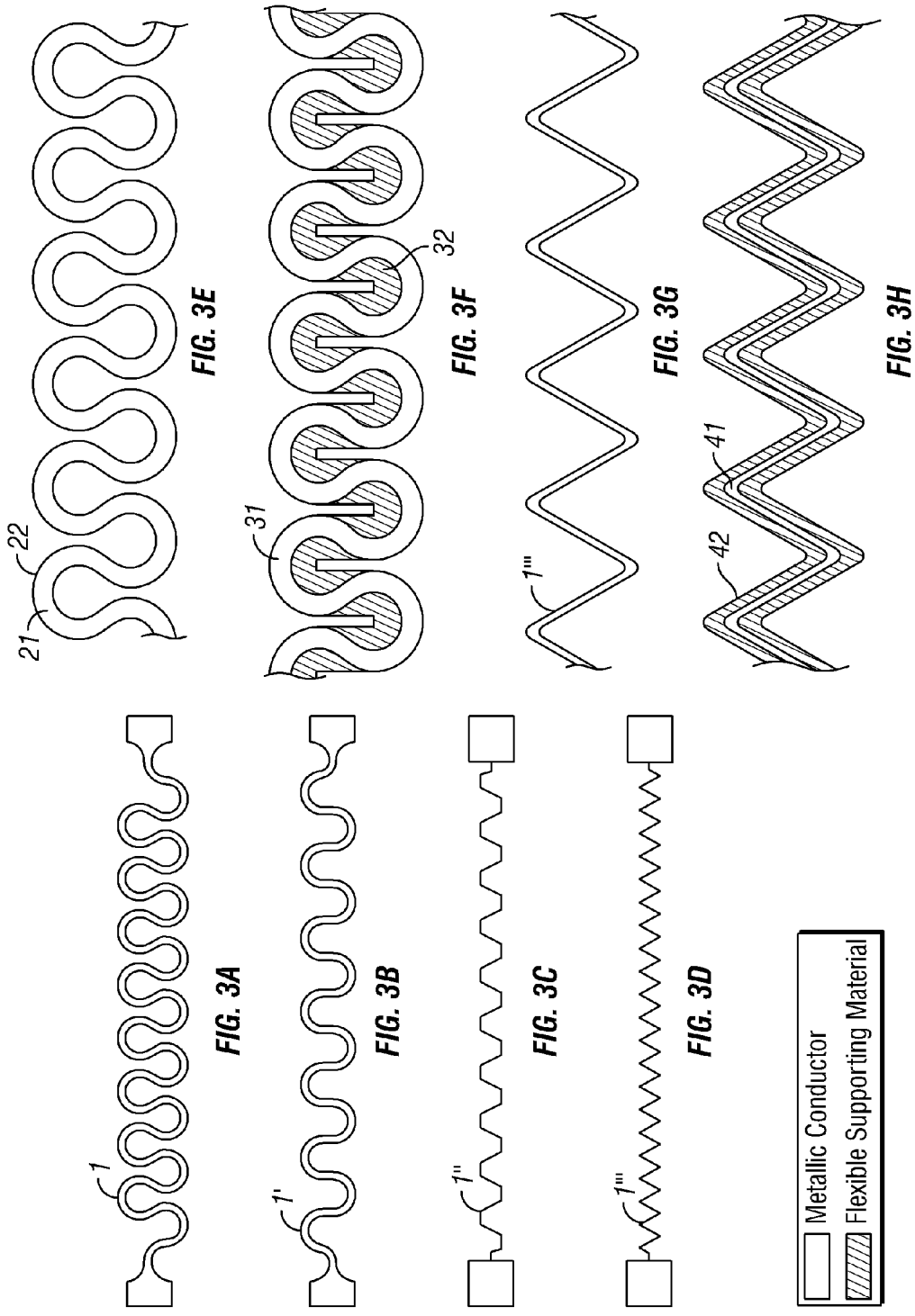
FIGS. 3(a)-3(d) show different shapes of stretchable electrically conductive channels.
FIGS. 3(e)-3(h) show different shapes of stretchable interconnections according to one embodiment comprising a flexible supporting layer leading to a stretch limitation.

The first stretchable interconnection, i.e. the first geometry of the first electrically conductive channel and/or the second geometry of the first flexible supporting layer, can have any meandering shape considered suitable by the person skilled in the art such as to make them stretchable, such as for instance, but not being limited thereto, a horseshoe shape 1, 1', as is shown in FIGS. 3(*a*) and 3(*b*), a trapezoidal shape 1'', as is shown in FIG. 3(*c*) or a triangle shape 1''', as is shown in FIGS. 3(*d*), 3(*g*) and 3(*h*).

In FIG. 3(*h*) a stretch stop/limiter is introduced by increasing the width of the second geometry of the first flexible supporting layer 42 compared to the first geometry of the first electrically conductive channel 41. The width of the second geometry is increased along its entire length, but may alternatively only be increased at certain parts, such as for instance at stress sensitive parts, i.e. at the turnings.

The first electrically conductive channel can be made of an electrically conductive material such as a metal or alloy, such as for instance Cu, Al, Au or TiW, of a polymer filled with conducting material, such as conducting particles e.g. metal particles, carbon nanotubes, etc. The conductive material can be intrinsically conductive polymers or any combinations of the above materials. The first electrically conductive channel can be made of two layers of different electrically conductive materials provided on top of each other, such as for instance a first layer being made of a metal and a second layer being made of an electrically conductive silicone.

The flexible supporting layer can be made of a flexible material, such as for instance polyimides or acrylates.

Preferably, the first flexible supporting layer comprises a support part 63, 73, 83 at an end of the stretchable interconnection for supporting at least one of the electronic components as is shown in FIGS. 5, 6, 7 and 8. These support parts create flexible circuit islands on which several electronic components or interposers 69, 79, 89 can be mounted. These islands are flexible, not stretchable, grouping and protecting the components being non-stretchable. The components can be for example SMD components or a single or multilayer flex structure with or without components.

In general, the flexible supporting layer can serve different functions:
(1) Providing flexible circuit islands
(2) Providing shaped (non-straight) flex edges, e.g. tapered, such that a gradual transition from the flexible support part to the stretchable interconnection is realized. (FIG. 5(*b*) and in detail FIG. 7)
(3) Providing a support or a complete flex embedding of the meandering stretchable conductor, including a stretch stop or stretch limitation for this conductor if the supporting layer is designed appropriately.

Figure 2:
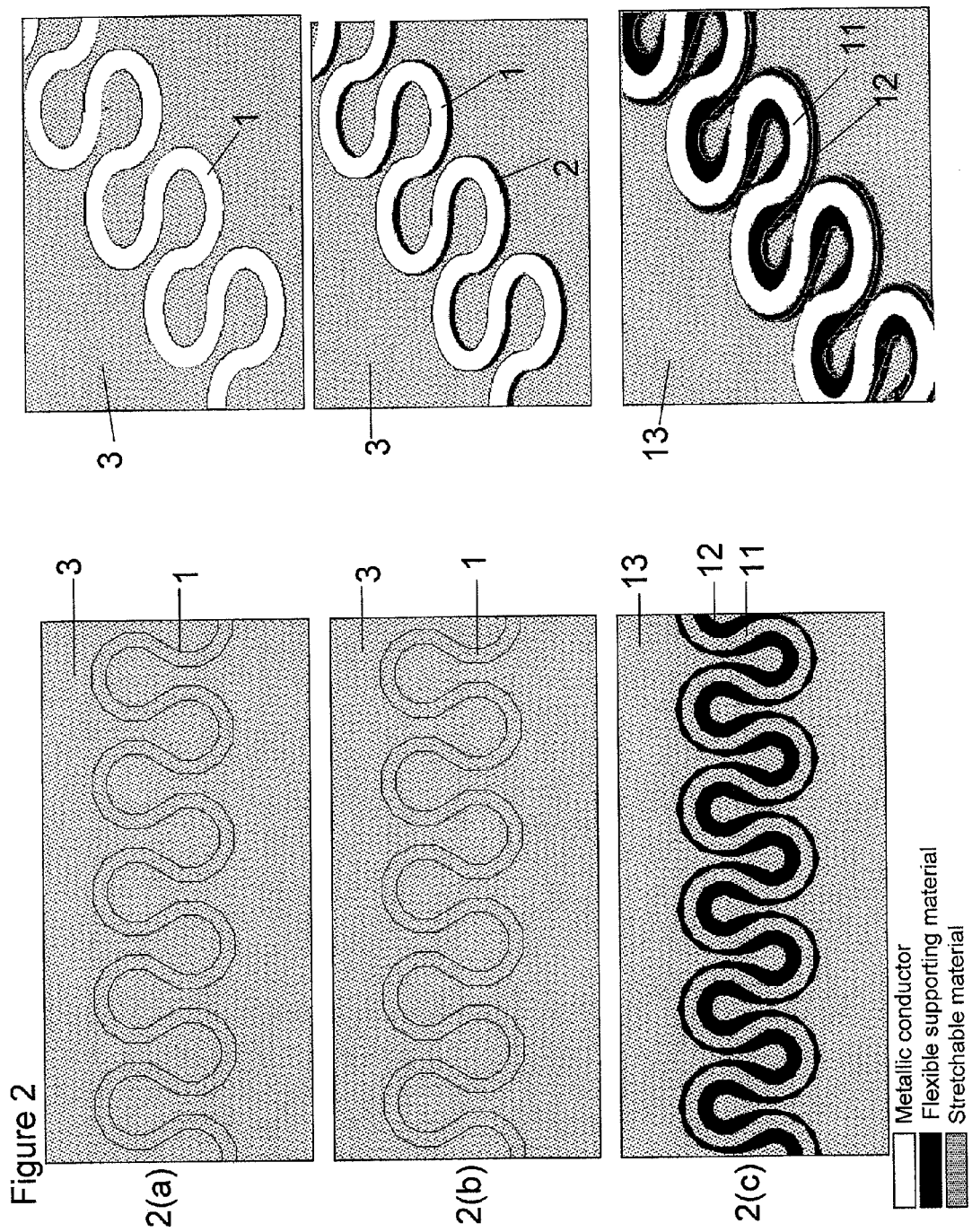
FIG. 2(a) shows a top view and a side view of a meander shaped electrically conductive channel embedded in a stretchable material according to the state of the art.
FIG. 2(b) shows a top view and a side view of a meander shaped electrically conductive channel supported by a flexible supporting layer and embedded in a stretchable material according to the state of the art.
FIG. 2(c) shows a top view and a side view of a meander shaped electrically conductive channel supported by a flexible supporting layer such that a stretch stop is introduced according to certain embodiments and embedded in a stretchable material.

Preferably, the stretchable interconnection is embedded in a stretchable material 13, providing the connection with an additional support, as is shown in FIG. 2(*c*).

Figure 4:
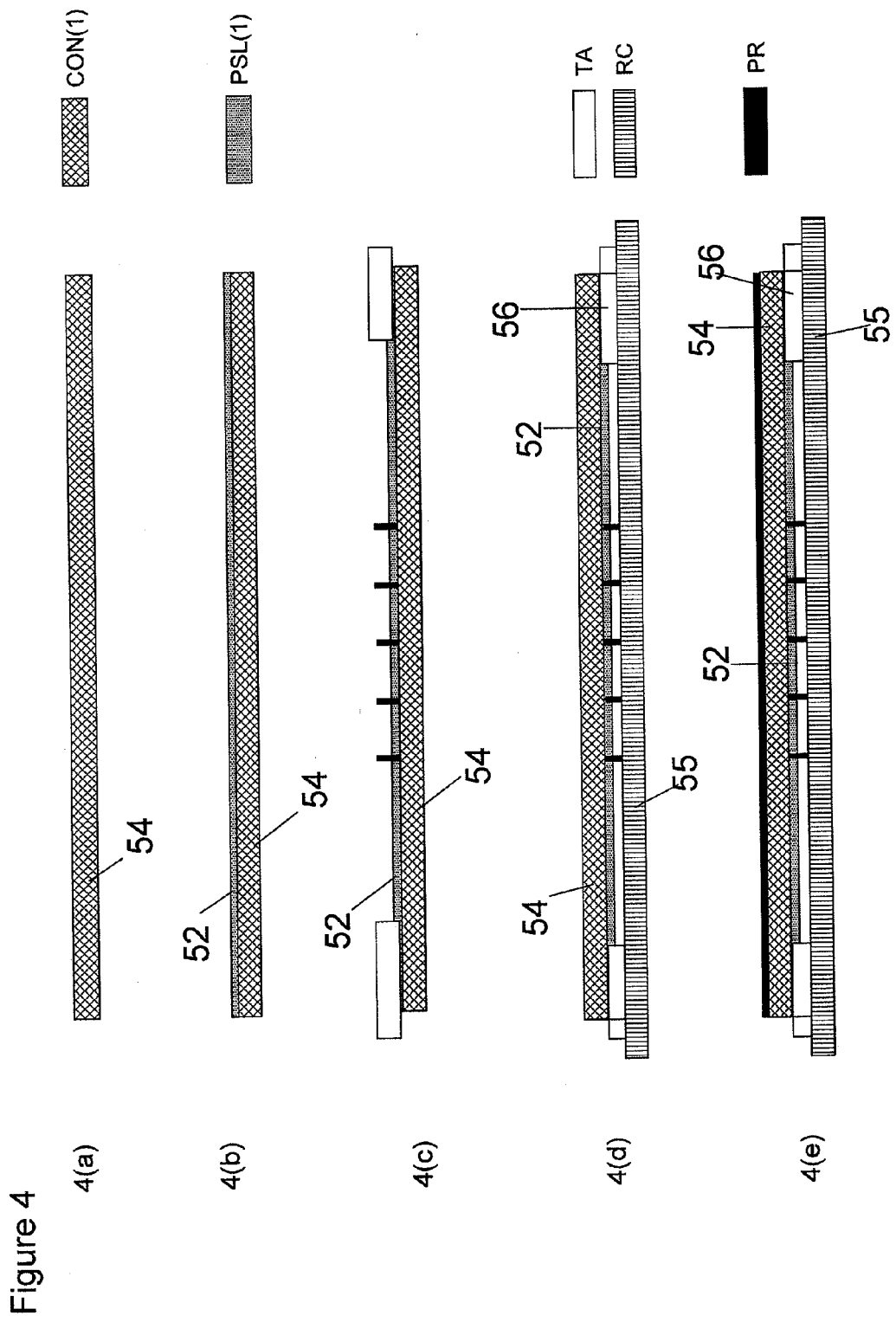
FIGS. 4(a)-4(s) show the different process steps for realizing an embodiment of a stretchable electronic device according to one embodiment.
Figure 4:
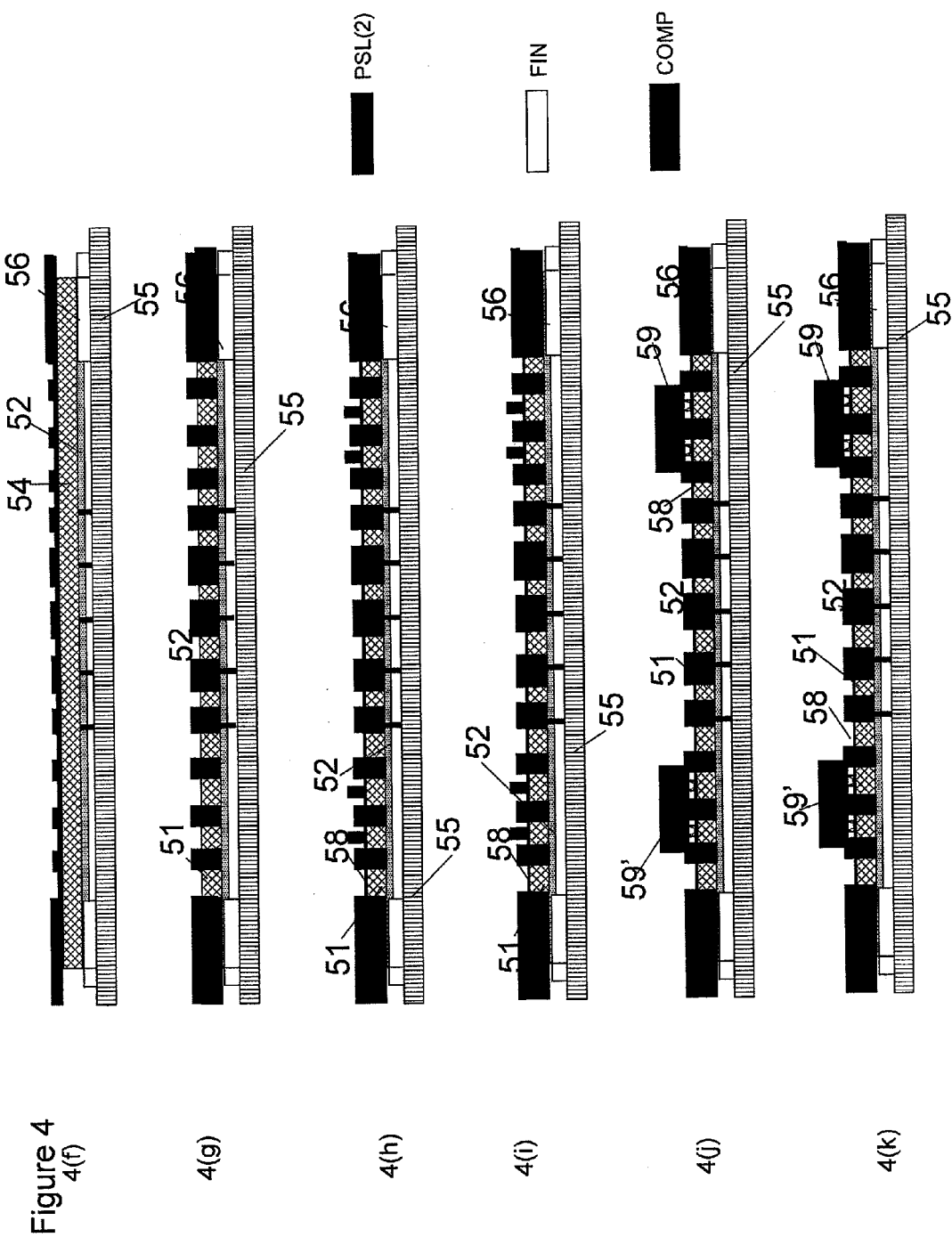
Figure 4:
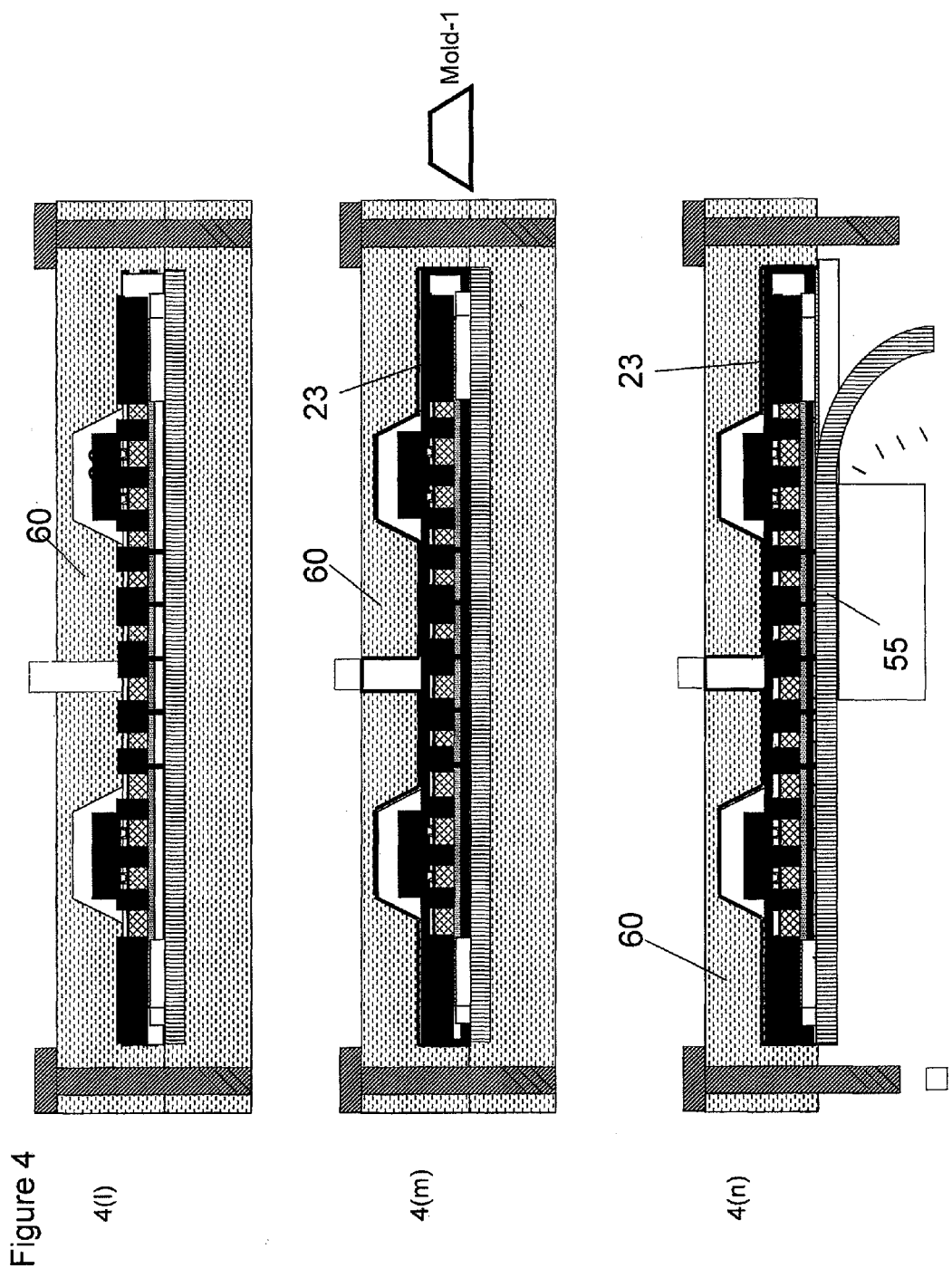
Figure 4:
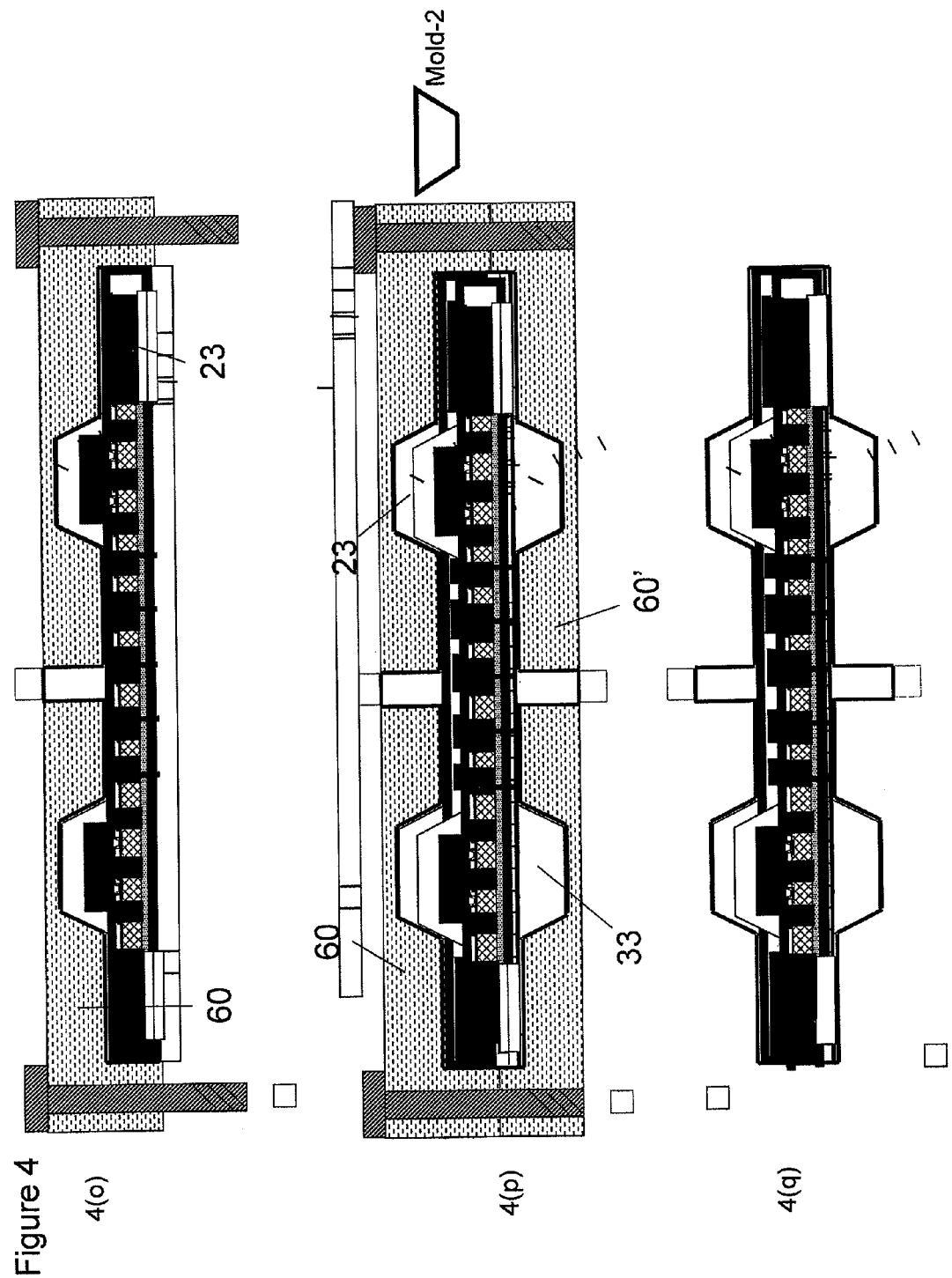
Figure 5:
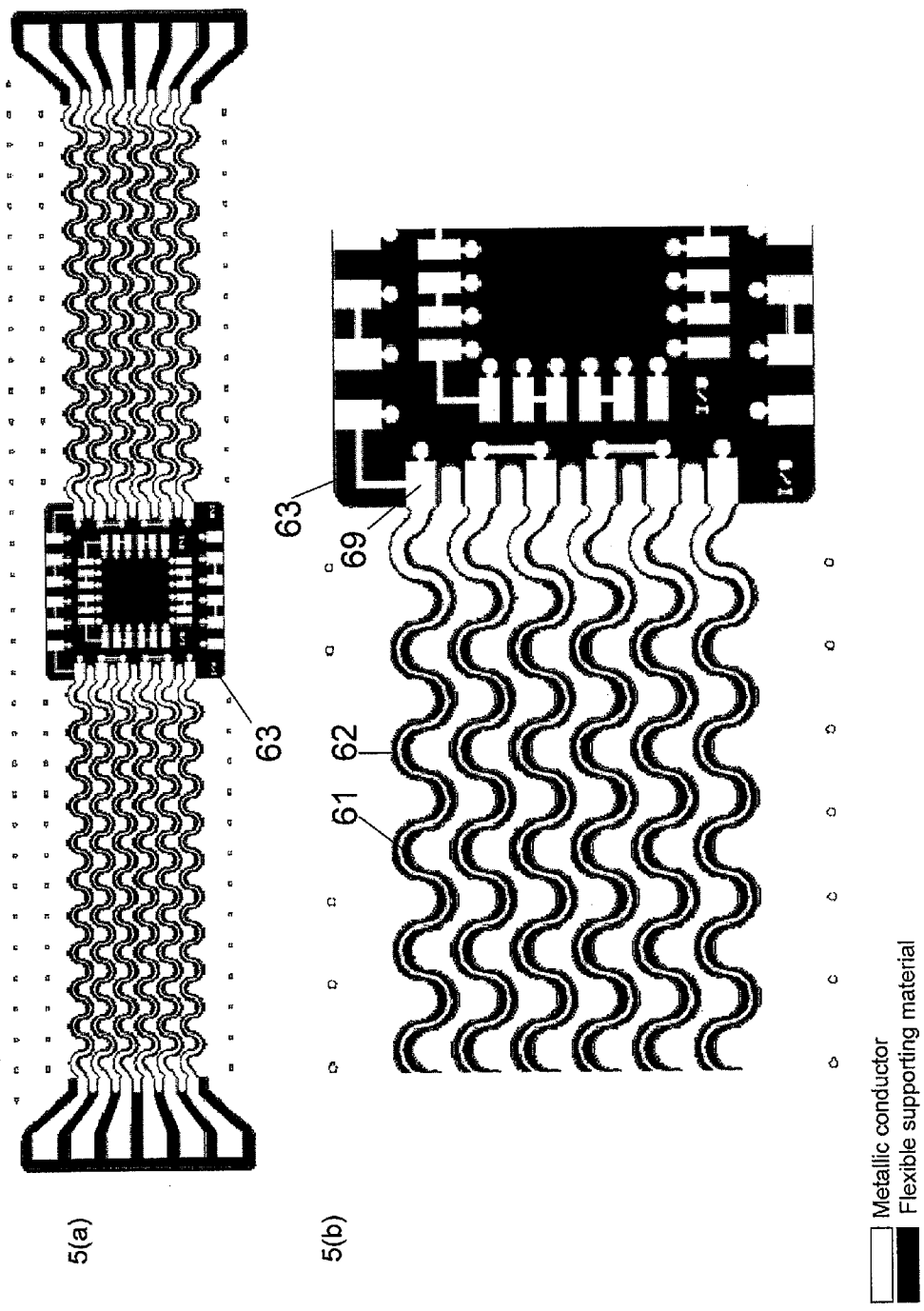
FIGS. 5(a) and 5(b) show a top view of an embodiment of a stretchable electronic device according to one embodiment.
Figure 6:
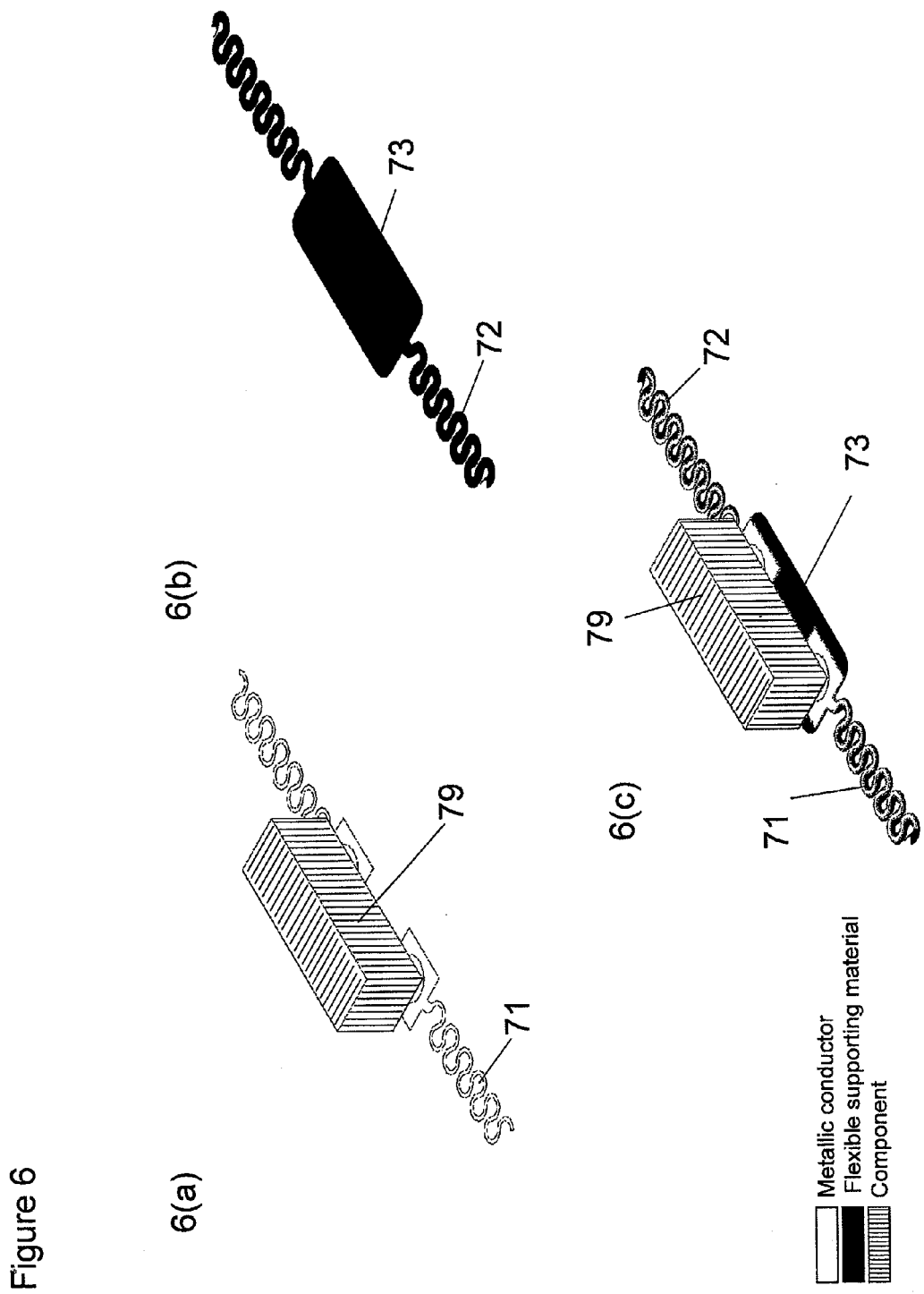
FIGS. 6(a), 6(b) and 6(c) show an embodiment of a stretchable electronic device according to one embodiment comprising stretchable interconnections and electronic components supported by a flexible layer acting as stretch limitation/stretch stop under the stretchable interconnections and electronic components.
Figure 7:
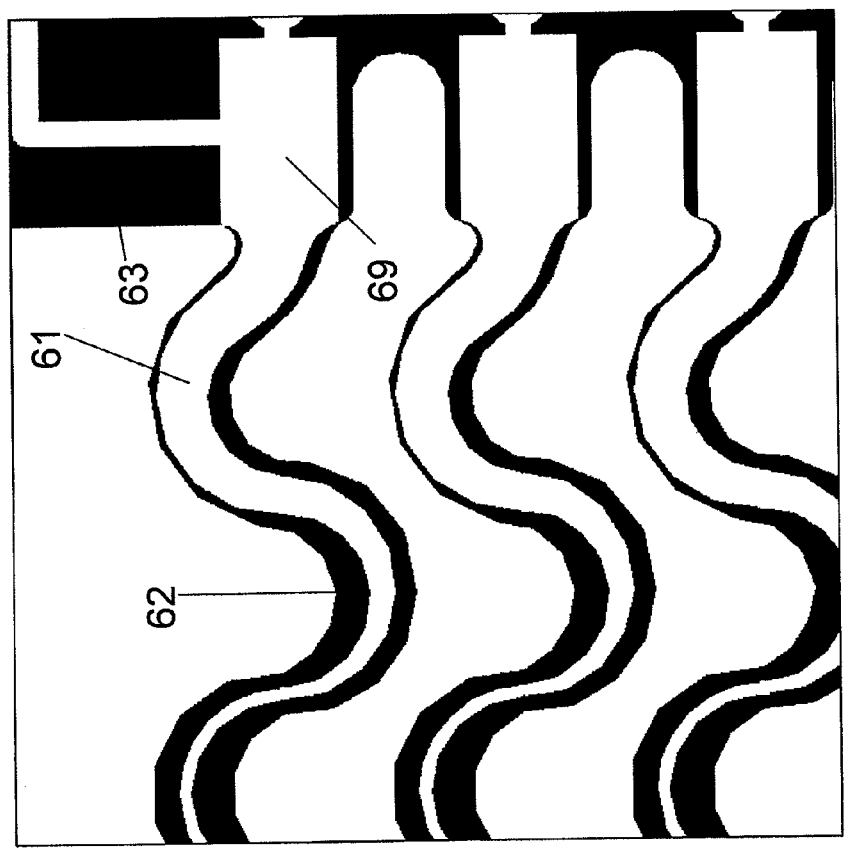
FIG. 7 shows a detail of an embodiment of a stretchable electronic device according to one embodiment.

In FIGS. 4(*a*)-4(*s*), the different processes of one embodiment of a method for manufacturing a stretchable electronic device according to an embodiment of the invention with a single conductor layer are shown:

1. In a first process, a conductor sheet CON(1) 54 is used as starting point (FIG. 4(*a*)), for example a flexible Cu sheet of 18 micron thick can be selected.
2. In a next process, a first patterned supporting layer PSL-1 52 (FIG. 4(*b*)) is applied on the conductor sheet 54, for example by spinning and patterning, or by screen printing a flexible material such as polyimide, epoxy, PDMS with high stiffness on the conductor. The layer is preferably defined on places where stretchable interconnections will come and where component islands are (FIG. 4(*c*)). Also, at the interface between both regions—stretchable interconnects on one hand, component islands at the other—a transition between both, tapering in the patterning of the PSL-1 layer, is preferably foreseen. The PSL-1 layer 52 has a second predetermined shape by which it is stretchable, the shape being different compared to the shape of the meanders of the conductive sheet (to be patterned later on in the process) leading to a stretch limitation. The supporting layer PSL-1 52 can be conductive or non-conductive.
3. Optionally, the conductor sheet CON(1) 54 and supporting layer PSL-1 52 are preferably bonded with a temporary adhesive TA 56 on a, preferably rigid, carrier RC 55 (FIG. 4(*d*)). The carrier can also be flexible, but processing on a rigid carrier is easier.
4. Next, the conductor sheet 54 is patterned, for example by lithography and wet etching of the conductor sheet (FIG. 4(*e*), 4(*f*), 4(*g*)) with a predetermined first geometry to form the first electrically conductive channel 51 of the device. In this way, stretchable conductors are defined and the flexible island is foreseen of copper tracks and contacts for components.
5. Optionally a second patterned supporting layer PSL-2 58 can be applied on top of the patterned conductor (see FIG. 4(*h*)) and the flexible islands. Patterning of this second supporting layer can be identical to that of the first supporting layer 52 or to that of the metal conductor 51, but also can be different. Patterns of the two supporting layers 52, 58 can be the same or different from that of the conductor, especially on top of the meanders. In the case of different meander patterns of the supporting layers, different maximum stretchabilities of the supporting layers and the conducting meanders, whereby the maximum stretchability of the supporting layers is smaller than the maximum stretchability of conducting meanders, introduce stretch limitation of the conducting meanders.
6. Optionally, on the metal layer a finish (e.g. electroless NiAu plating on Cu) can be applied for soldering the components (FIG. 4(*i*)).
7. Then the components COMP 59, 59' are mounted (FIG. 4(*j*)) for example by soldering. The circuit can be tested and repaired if necessary. This is an important and unique feature of being able to test the circuit before embedding it into a stretchable material.
8. Optionally, an adhesion promotion action can be applied (e.g. apply adhesion promoter, perform plasma treatment, etc.) to ensure a good adhesion between electronic circuit and molding material (FIG. 4(*k*)). Then the molding material MOLD-1 23 can be applied on top of the circuitry and the components (FIG. 4(*l*), 4(*m*)). First, the top mold 60 is placed upon the circuit with slots on the places where a thicker layer of molding material is needed and on places where components are present (FIG. 4(*l*)). Then, the molding material 23 is injected, filling the foreseen slots and covering the whole circuitry, leading to a partial embedded electronic system (FIG. 4(m)). The molding material is then cured.

9. Optionally, the lower mold is removed, while the top mold 60 stays in its place. The carrier 55 is released while the circuitry stays in the molding material 23 still being in the top mold 60. The carrier is released by melting and/or dissolving the temporary adhesive TA (FIG. 4(n), 4(o)).

10. Optionally, an adhesion promotion action is performed (e.g. apply adhesion promoter, perform plasma treatment, etc.) and molding material MOLD-2 33 is applied on the back of the circuit by use of bottom mold 60' (FIG. 4(p)). In most of the cases material MOLD-2 33 is equal to MOLD-1 22, but it can also be different.

11. Optionally, in a final process the whole is being unmolded (FIG. 4(q)).

Experiments

Figure 10:
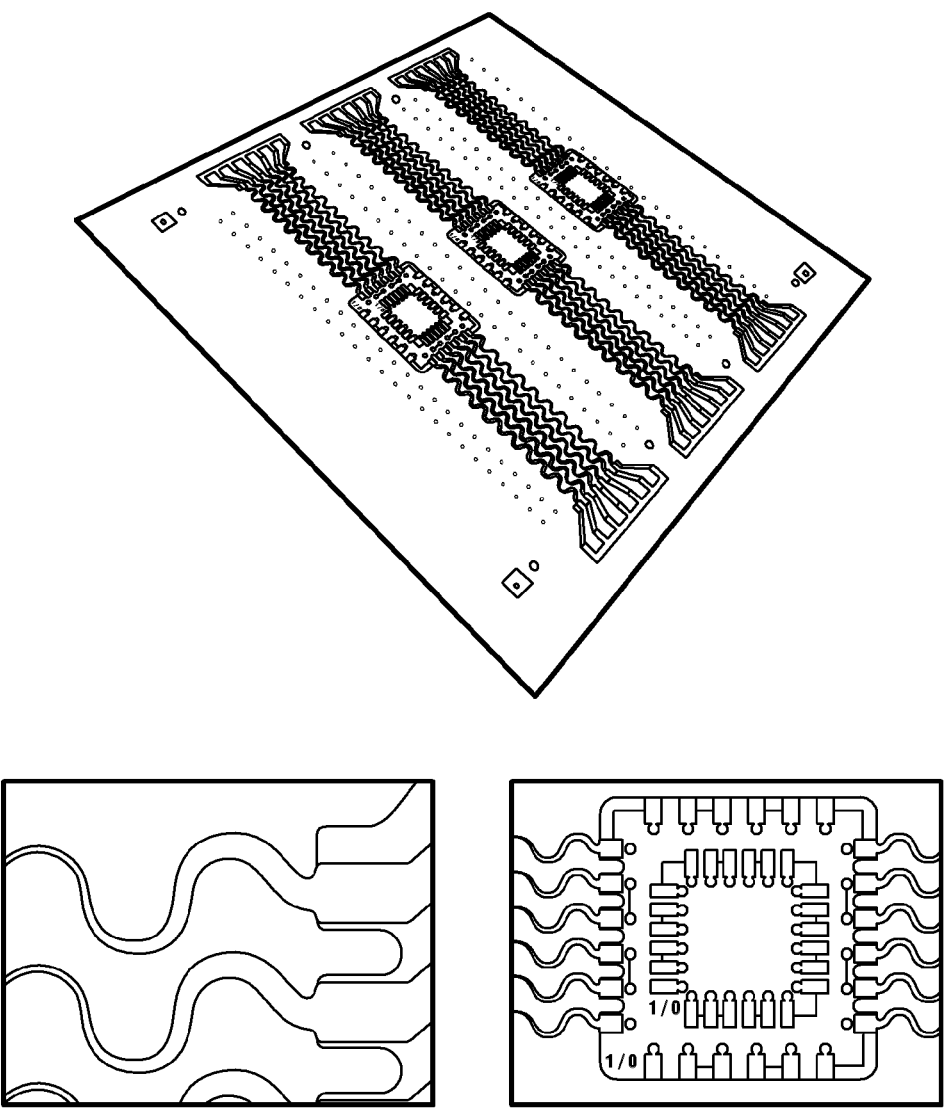
FIG. 10 shows a polyimide supported substrate with copper patterns after applying a solder mask.
Figure 11:
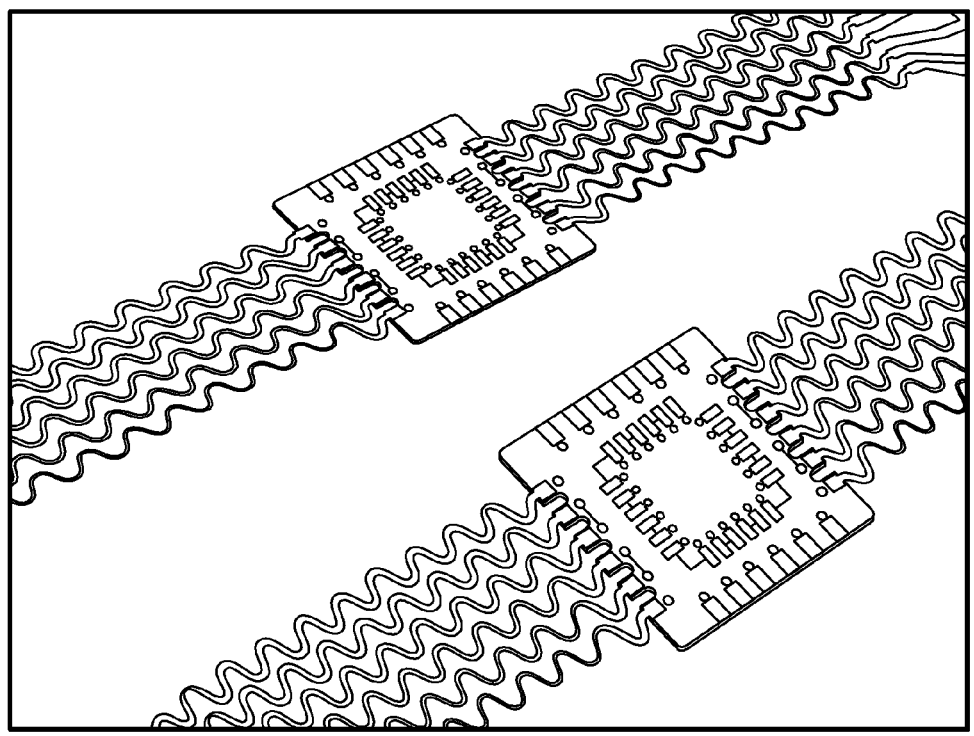
FIG. 11 shows a polyimide supported substrate with copper patterns embedded in Sylgard 186.

The feasibility of the process flow has been proven as follows (see FIGS. 9 to 11). A TW-YE copperfoil (Circuitfoil) of 10 cm by 10 cm 18 μm was selected. Then a photodefinable polyimide HD4100 (HD Microsystems) was spun on the copper foil. Spinning was done during 10 secs at 500 rpm and 30 secs at 1500 rpm. A softbake of the polyimide was done on a hotplate during 5 minutes at 90 degrees followed by 5 minutes at 110 degrees. To pattern the polyimide, illumination was done through a TiW patterned glass mask during 40 seconds by UV light (8 mW/cm$^2$). Next, the polyimide was developed by use of PA400D and PA400R (HD Microsystems). The development process was the following:

3 minutes in PA400D
2 minutes in a PA400D/PA400R 1:1 solution
3 minutes in PA400R
rinse with DI water brush Then the polyimide was cured in a nitrogen oven. The curing temperature profile was the following:

heating from room temperature to 200° C., with a ramp rate of 4° C. per minute
30 minutes at 200° C.
heating from 200° C. to 375° C., with a ramp rate of 2.5° C. per minute
60 minutes at 375° C.
cooling down to room temperature Thereby a layer of ~15 μm polyimide on the copper is obtained. Following the hardbake, a layer of Quickstick 135 wax (South Bay Technology Inc.) is spun on the polyimide side. The stick was dissolved in 30 ml of acetone and spinning was done during 30 sec. at 1000 rpm. On an etched RO4003 substrate, the same layer of wax was spun. The substrate was used as a temporary carrier during the different process steps. Both substrates were then laminated, to obtain a carrier-wax-polyimide-copper stack.

Before the application of a photoresist, the surface of copper can be prepared for cleanliness and good adhesion. Inadequate adhesion may result in resist breakdown during spray etching of the copper. Preposit-Etch E25/29 (Shipley) was used as a micro-etchant for our surface preparation. After the Preposit Etch E25/29, substrates were rinsed immediately in 10% HCl solution, followed by a rinse in DI water.

AZ4562 (Shipley) was spun during 1 min at 2000 rpm. The softbake was done on a hotplate during 15 mins. at 60° C. followed by the illumination during 22.5 secs under a 8 mW/cm$^2$ UV lamp. The samples were developed in a 1:1 solution of Microposit Developer and DI water. The developing time was 2 mins. The lithography process was ended by a hardbake during 15 mins on a hotplate at 60 degrees. This low temperature avoids the wax from melting, leading to a bad adhesion of the polyimide-copper layer to the substrate.

In a next process, etching of copper was done in a HCl/CuCl solution at 55° C. during 4 mins. Rinsing and stripping the photoresist in a non-diluted AZ 400 k solution bath was done next, followed by a DI water rinse. Because the wax dissolves in acetone, acetone is not used to strip in order to avoid delamination of the polyimide-copper from the carrier.

In a next process, a soldermask is applied. This was done by screenprinting ELPEMER SD2463 FLEX HF soldermask on the samples. A prebake was done during 45 mins at 75° C. Illumination of the samples was done by use of an 8 mW/cm$^2$ UV-lamp during 25 secs. Developing was done in a 1% Na$_2$CO$_3$ solution. A final hardbake of the sample was done during 60 mins at 150° C., resulting in a cured soldermask layer with thickness ~25 μm. Before soldering components, the copper is cleaned again in the same way as done before applying the photoresist.

Components were mounted by a SAC (tin/silver/cupper) solderpaste and put in a vapor phase oven. Soldering happens at 250° C.

After soldering, an adhesion promoter OS1200 primer (Dow Corning) was applied. This was done to improve the adhesion between components, soldermask, copper and polyimide to the stretchable molding material.

Next, Sylgard 186 (Dow Corning) was applied by molding. The Sylgard 186 was cured during 8 hours at 50° C. The adhesion promoter was needed for several days to result in a sufficient adhesion between the circuit and the Sylgard 186, so the temporary carrier was only removed after several days by heating up the sample in order to melt the wax. Therefore, the mold is placed on a hotplate at 200° C. and when the wax is molten, the carrier is removed. The wax was cleaned with acetone and a rinse in water was done.

Then, an adhesion promoter is applied on the back, the bottom mold is applied and again Sylgard 186 is injected into the bottom mold. Curing is again done at 50° C. for 8 hours. After some days, the mold is removed. The resulting structure is an electronic circuit completely embedded in Sylgard 186.

Simulations show that a semi-transition structure decreases the maximum of plastic stress within a stretchable part by 30%, and therefore increases the life time of the stretchable part.

Experiment 1: Semi-Stretch Interconnection Fabricated as Interconnecting Element.

The design consists in three parts (FIG. 7):
Connecting pads to the stretchable electronic board
Semi stretchable interconnects
Connecting pads to the flex.

The connecting pads are polyimide, covered with copper. The connecting pads to the stretch are attached together with a polyimide band to ease the manipulation after removing the support at the end of the process.

First, a polyimide foil (18 mm thick) covered with copper (9 μm thick) is patterned using standard photolithography and etching to create the pads and the interconnections between the pads. Then the substrate is stuck to a ceramic plate with double sided tape as a glue layer. Then a YAG laser is used to cut the polyimide foil to shape the semi-stretch interconnections, and then the semi-stretch interconnections are removed from the glue using heat. Then the semi-stretch is soldered with lead free reflow oven to the stretchable circuit and then to the flex board.

Experiment 2: Semi-Stretch Interconnection Fabricated with Photo-Lithography.

Figure 8:
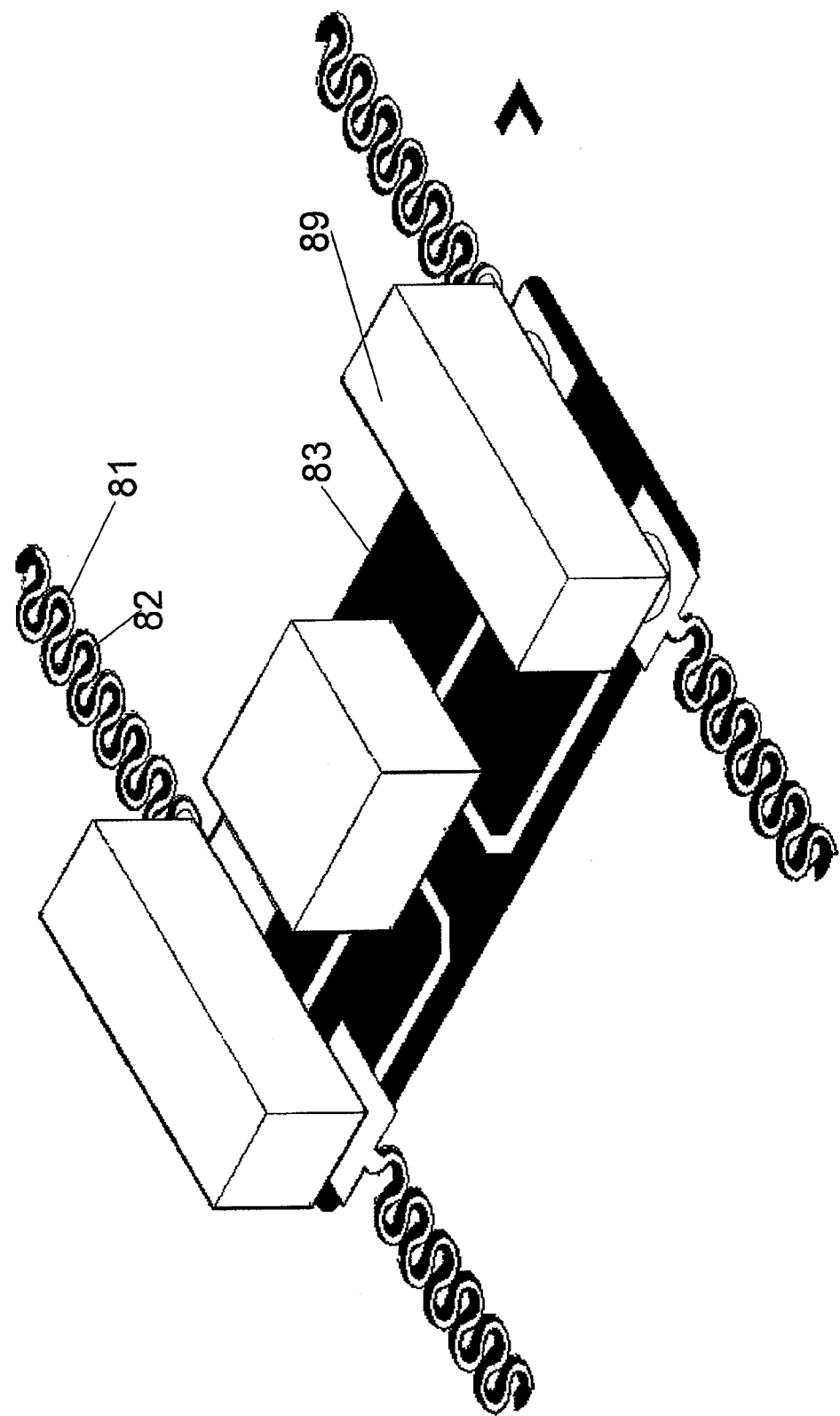
FIG. 8 shows a three-dimensional view of an embodiment of a stretchable electronic device according to one embodiment.

The production starts with a plain copper foil, TW-YE (Circuitfoil), which is rough at one side and smooth at the other. Polyimide patterns e.g. non-stretchable islands and meanders are fabricated to support the metallic meanders, on the rough side of the copper. Due to the roughness of the copper and the self-priming property of the polyimide, we get a good adhesion. PI2731 was used as photo-definable polyimide to obtain the structures through spin-coating and photolithography. The samples are hard-baked in a nitrogen atmosphere following a dedicated temperature profile. With the laser, alignment holes are defined, to be able to pattern the copper on the backside relative to the polyimide structures. The copper with polyimide patterns is then laminated by use of wax on a flexible carrier, with the polyimide structures sandwiched between the copper and the carrier. Again, through standard lithography by use of photoresist AZ4562 and etching of the copper, structures are defined in the copper. Embedding is done through molding or casting by use of a stretchable polymer. Following this procedure, we obtain stretchable parts, e.g. the copper meanders which are supported by the polyimide and non-stretchable flexible parts e.g. islands with components on supported by polyimide. The transition between both is semi-stretchable as the width of the meanders is increasing close to the flexible part (FIG. 8).

Certain embodiments relate to a method for fabricating stretchable electronic devices comprising electronic components and a double level stretchable interconnection, wherein the double level stretchable interconnection comprises a first stretchable interconnection comprising a first electrically conductive channel and a second stretchable interconnection comprising a second electrically conductive channel crossing the first electrically conductive channel, wherein the first electrically conductive channel and the second electrically conductive channel are electrically isolated from each other by a flexible electrically insulating layer, e.g. a polyimide layer, e.g. the first flexible supporting layer. A double level stretchable interconnection according to one embodiment comprises a first conductor layer and a second conductor layer. Electrical connections between the first conductor layer and the second conductor layer are provided at predetermined locations through vias extending through the flexible electrically insulating layer.

Figure 12:
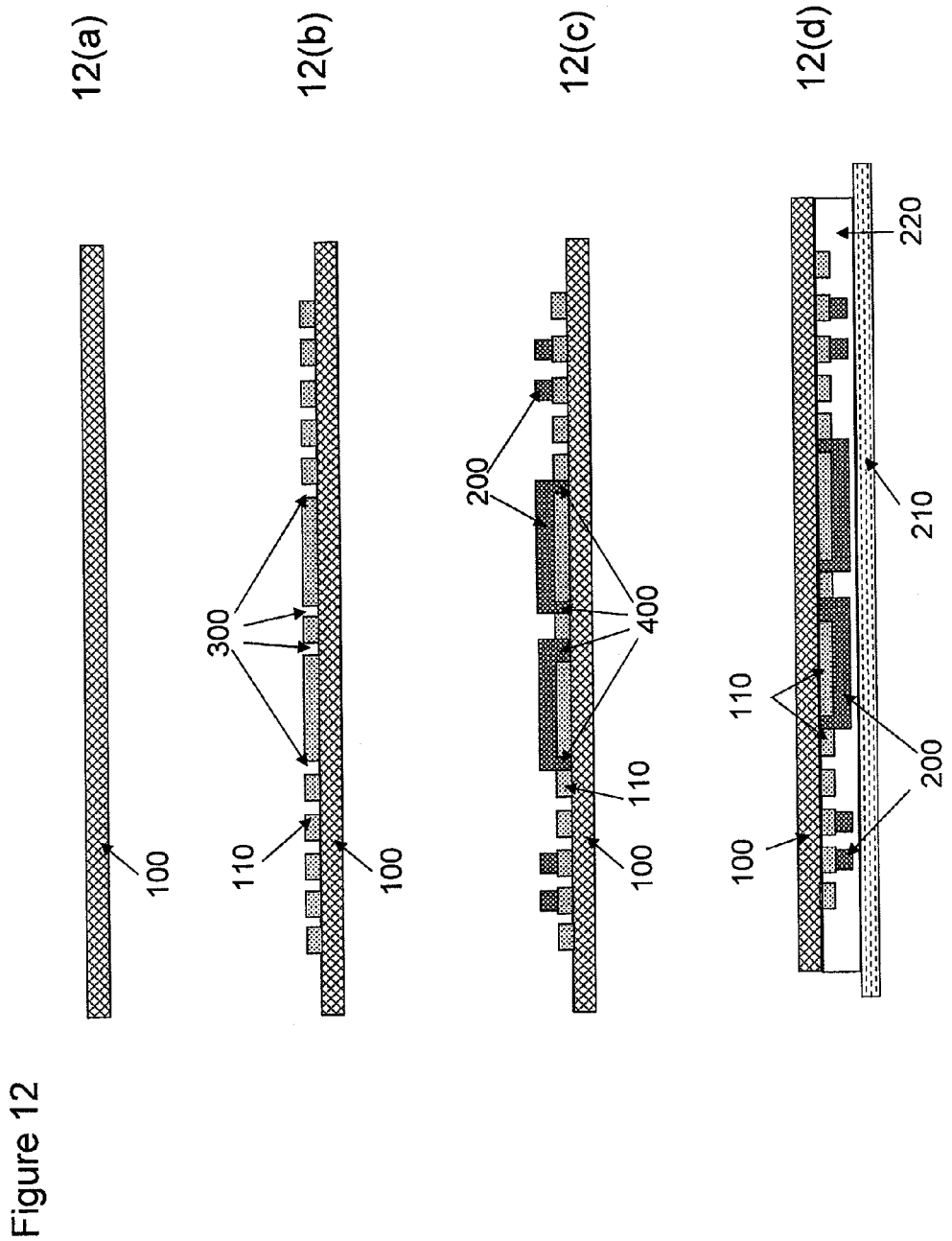
FIG. 12 illustrates a process flow for fabricating a stretchable electronic device comprising double level stretchable interconnections according to an embodiment of the present invention.
Figure 12:
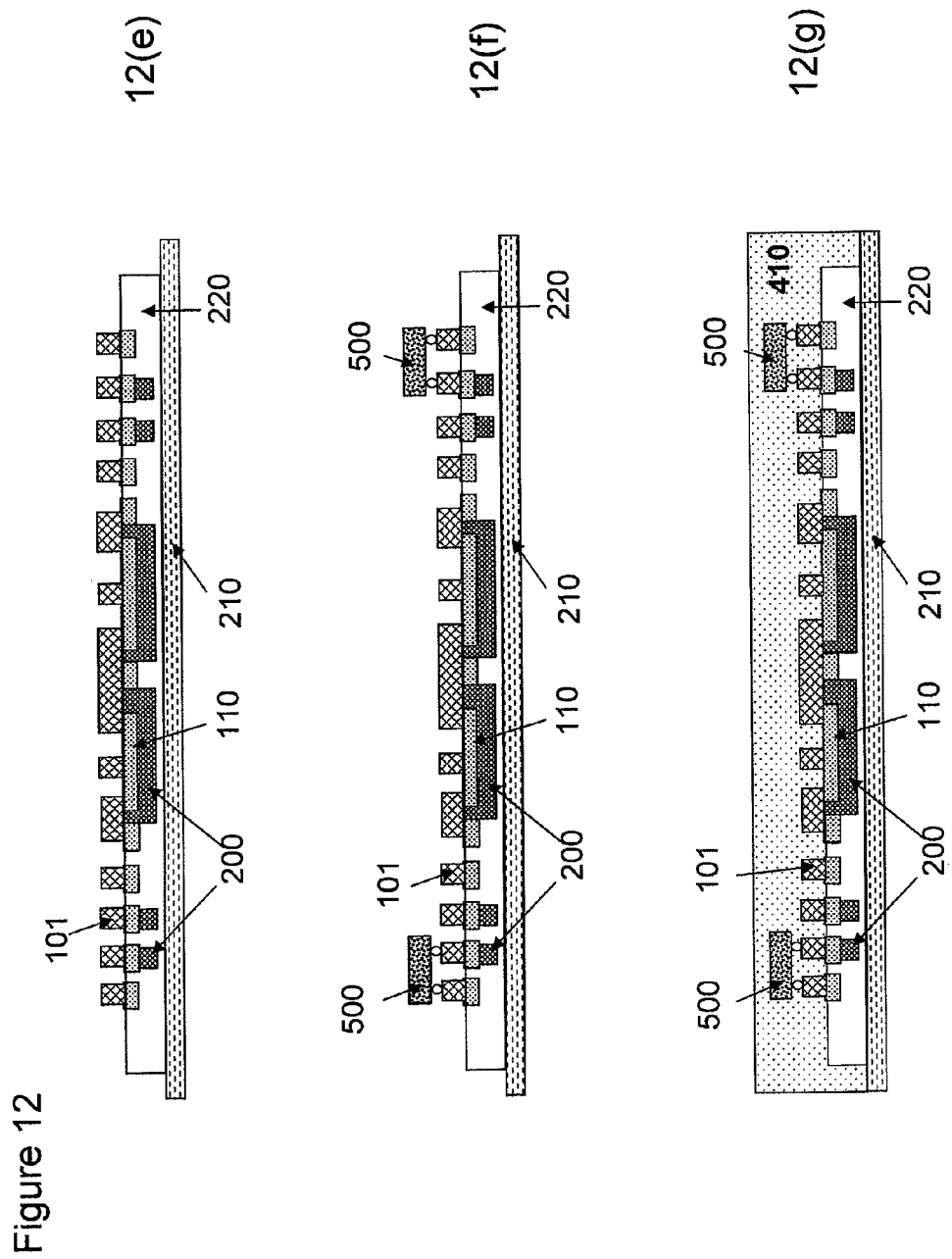
Figure 12:
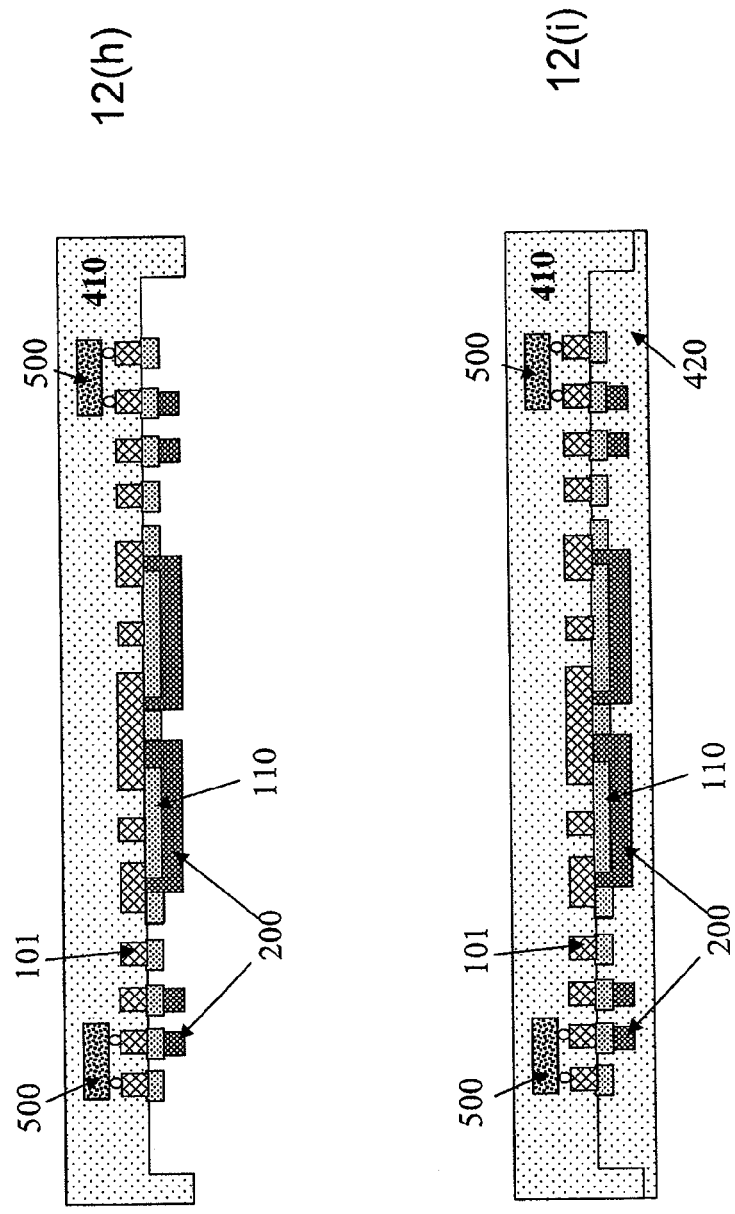

A method for manufacturing a stretchable electronic device with a double metallization level (comprising a first conductor layer and a second conductor layer) according to an embodiment of the present invention is schematically illustrated in FIG. 12.

In a first process, illustrated in FIG. 12(a), a conductor sheet 100 is provided. For example, a flexible Cu sheet can be used. Any other patternable metal, available as a sheet, could be used. In a later stage of the process (as further described) this conductor sheet 100 will be patterned to provide a first patterned conductor layer 101, forming the first electrically conductive channel and part of the second electrically conductive channel of the double conductor layer circuit of one embodiment.

In a next process, a first patterned flexible supporting layer 110 (illustrated in FIG. 12(b)) is applied on the conductor sheet 100, for example by spinning and patterning, or by screen printing a flexible material such as polyimide, epoxy, PDMS with high stiffness. The first supporting layer 110 is a flexible layer comprising an insulating material that will have a supporting function and an insulating function (between the first electrically conductive channel and the second electrically conductive channel) in the final device. Patterning of the first supporting layer 110 can for example be done by a photolithographic process or by screenprinting. For example, polyimide (being available in photodefinable form and in screenprintable form) can be used as a material for forming the first patterned supporting layer 110. After providing the material for forming the first patterned supporting layer 110, the material is preferably cured in order to obtain good mechanical and chemical durability characteristics. The first flexible supporting layer 110 is used as a support for the first electrically conductive channel to be formed in a later stage of the process and as a support to the second electrically conductive channel to be formed in a later stage of the process. It is also used as a support for flexible functional islands where straight conductor tracks are defined and SMD components are mounted. Therefore, the first flexible supporting layer 110 is preferably provided at locations where stretchable interconnections (first electrically conductive channel and second electrically conductive channel, e.g. meandering channels) will be formed in a later stage of the process, and where functional flexible islands (flexible supporting islands) are provided. The first supporting layer 110 is also used as an insulating layer between the first electrically conductive channel and the second electrically conductive channel. Therefore, the first flexible supporting layer 110 is preferably also provided at locations where the two channels (first electrically conductive channel and second electrically conductive channel) cross each other.

Vias 300 are provided by patterning holes in the first supporting layer 110 at locations where an electrical connection is needed between the first conductor layer and the second conductor layer. For example, the first electrically conductive channel can be made in the first conductor layer; the second electrically conductive channel can be partially made in the first conductor layer and partially (at cross-over points) in the second conductor layer. Then there is a need for forming an electrical connection between parts of the second electrically conductive channel formed in the first conductor layer and parts of the second electrically conductive channel formed in the second conductor layer. Such electrical connection can be provided through vias 300 in the first supporting layer 110. In case a photodefinable flexible first supporting layer 110 is used, patterning of the first supporting layer for forming vias 300 can be done by photolithography. In case a screenprintable flexible first supporting layer 110 is used, patterning can be done directly by providing a suitable screen with appropriate patterns. FIG. 12(b) shows the structure after patterning of the first supporting layer 110, wherein e.g. meander shaped structures are defined and wherein vias 300 are defined for making a connection between the first conductor layer and a second conductor layer.

Then a patterned second conductor layer 200, such as e.g. a conductor layer comprising a conductive polymer (e.g. Dupont 5025 Polymer Silver Conductor) is provided, for example by means of a printing technique (e.g. screenprinting, inkjetprinting). A metal can also be used for forming the second conductor layer 200, e.g. by means of a printing technique (e.g. inkjet printing) or by sputtering. By printing the second conductor layer 200, a patterned layer can be provided comprising bridges 400 for providing an electrical contact between the first conductor layer 100 and the second conductor layer 200 through the vias 300 defined in the first flexible supporting layer 110. This is illustrated in FIG. 12(c). The patterned second conductor layer 200 can also comprise straight tracks (e.g. non-stretchable straight tracks) at locations where the flexible functional islands are foreseen and it may comprise meandered conductors at locations where a flexible support (first supporting layer 110) is available.

Then, as illustrated in FIG. 12(d), the structure comprising the first conductor sheet 100, the patterned first supporting layer 110 and the patterned second conductor layer 200 is bonded or laminated to a temporary (rigid or flexible, preferably rigid) carrier 210, e.g. by means of a temporary adhesive or glue 220 (e.g. wax) with the side comprising the second conductor layer 200 facing the temporary carrier 210. In this way the first conductor sheet 100 is available for patterning in a next process.

Next (FIG. 12(*e*)), the first conductor sheet 100 is patterned, for example by lithography and wet etching, to form a first patterned conductor layer 101. In this way, stretchable meandered conductors (first electrically conductive channel and part of the second electrically conductive channel) are defined and copper tracks and contacts for components are defined on the functional flexible islands.

Optionally a second patterned supporting layer can be provided on the patterned first conductor layer 101 and the flexible islands (not illustrated). Patterning of this second supporting layer can be identical to that of the first supporting layer 110, but it can also be different. Patterns of the first patterned supporting layer 110 and the second patterned supporting layer can be the same or different from that of the patterned first conductor layer 101 and/or the patterned second conductor layer 200. In the case of different meander patterns of the supporting layers, different maximum stretchabilities of the supporting layers and the conducting meanders introduce stretch limitation of the conducting meanders when the maximum stretchability of the supporting layers is smaller than the maximum stretchability of the conducting meanders.

On the second conductor layer 200 a finish, e.g. a copper finish (e.g. electroless NiAu plating on Cu, e.g. OSP) can be applied, followed by mounting and soldering (e.g. reflow soldering using SAC) of electronic components 500 (FIG. 12(*f*)) to the first electrically conductive channel and/or to the second electrically conductive channel. The first and second flexible supporting layers can withstand the soldering process. A polyimide is used as a support, thus it can withstand the soldering temperatures. The circuit can be tested and repaired if needed at this stage of the process.

Next the front side, i.e. the side where the components 500 are mounted, is molded using an elastomer such as for example PDMS. Optionally, an adhesion promoter can be applied or a plasma treatment can be performed before molding to ensure a good adhesion between the electronic circuit and the molding material. After providing a first mould, the molding material 410 is injected, covering the whole front side of the circuitry, leading to a partial embedded electronic system, as illustrated in FIG. 12(*g*). The molding material is then cured.

Then the temporary carrier 210 is removed from the circuitry, for example by melting and/or dissolving the temporary adhesive 220. The resulting structure is shown in FIG. 12(*h*).

After that, the rear side, i.e. the side where the second electrical conductor layer 200 is provided, is molded using an elastomer 420, preferably using the same elastomer as used at the front side. Optionally, an adhesion promoter can be applied or a plasma treatment can be performed before molding to ensure a good adhesion between the electronic circuit and the molding material. A second mould is then provided and molding material 420 (for example the same molding material as the one used at the front side) is injected into the second mould, thereby fully embedding the electronic circuit. The molding material is then cured and the second mould is removed. The resulting stretchable electronic device with double conductor layer is shown in FIG. 12(*i*).

Experiments

Figure 13B:
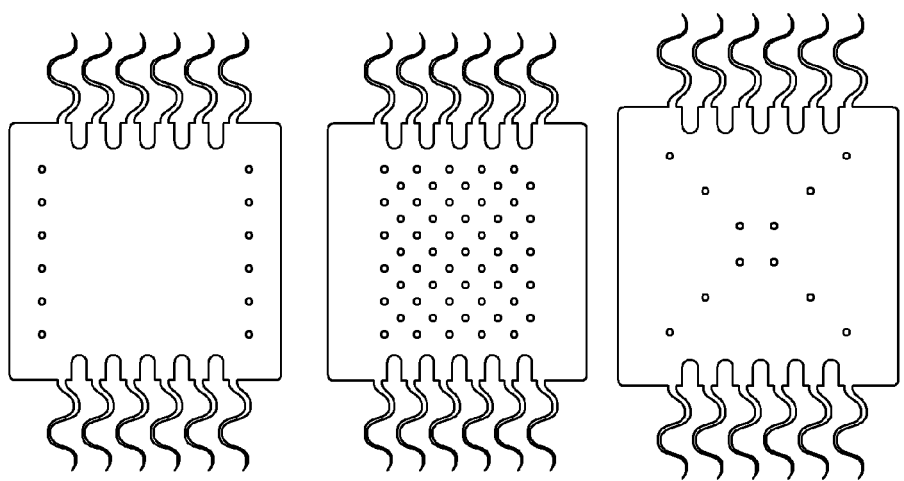
FIG. 13 shows photographs of a copper foil after providing a patterned polyimide layer, wherein flexible supporting islands, flexible supporting meanders and vias are defined.
Figure 13A:
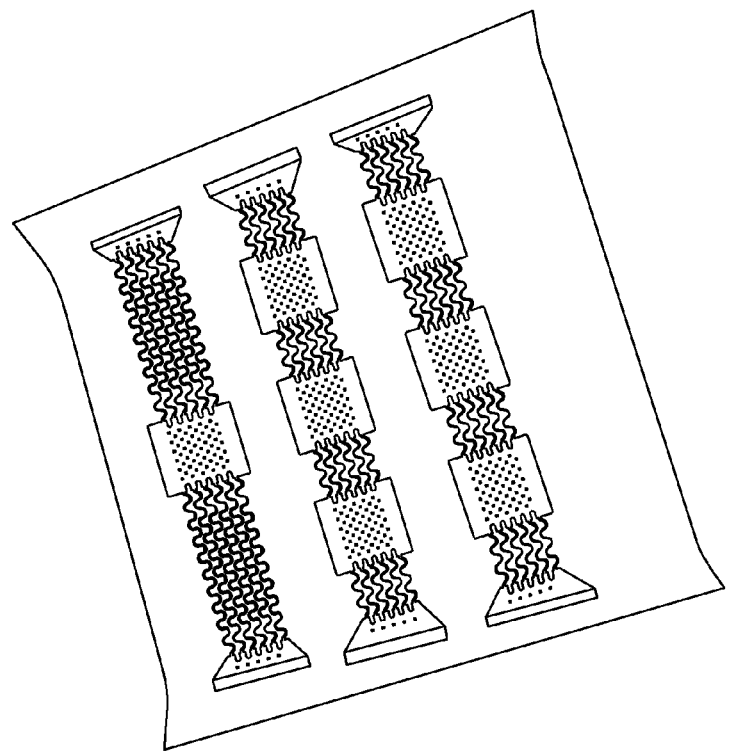
Figure 13C:
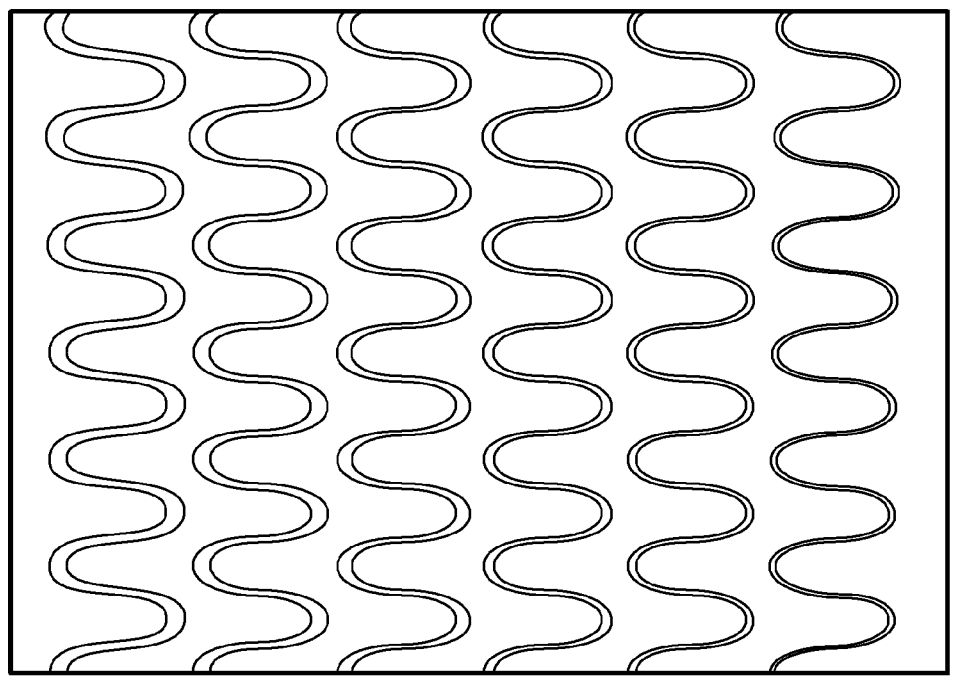

Experiments were performed using a 10 cm by 10 cm, 18 micrometer thick TW-YE grade copper foil (Circuitfoil). On the rough side of the copper foil a photodefinable polyimide layer (HD4100 from HD Microssytems) was provided by spin coating. Spinning was done during 10 seconds at 500 rpm and during 30 seconds at 1500 rpm. A softbake of the polyimide layer was done on a hotplate during 5 minutes at 90° C. followed by 5 minutes at 110° C. To pattern the polyimide, a photolithographic process was performed comprising illumination through a TiW patterned glass mask during 40 seconds using an 8 mW/cm$^2$ UV lamp, and developing the polyimide by use of PA400D and PA400R(HD Microsystems). The following developing process was used: 3 minutes in PA400D; 2 minutes in a PA400D:PA400R 1:1 solution; 3 minutes in PA400R; and rinsing with deionized water brush. Curing of the polyimide was performed in a furnace in a nitrogen atmosphere, using the following temperature profile: heating from room temperature to 200° C. with a ramp rate of 4° C. per minute; 30 minutes at 200° C.; heating from 200° C. to 375° C. with a ramp rate of 2.5° C. per minute; 60 minutes at 375° C.; and cooling down to room temperature. In this way a polyimide layer (first patterned flexible supporting layer 110) with a thickness of about 15 micrometer was obtained on the copper foil (conductor sheet 100). Alignment marks were provided in the polyimide layer and holes were drilled by laser through the polyimide layer and the copper layer. These holes are used for the alignment of copper patterns at the rear side of the structure relative to the patterned polyimide layer. These alignment marks are also used for the correct placement of the second conductor layer. FIG. 13 shows photographs of the copper foil after patterning of the polyimide layer, wherein flexible supporting islands, flexible supporting meanders and vias are formed. As can be seen in FIG. 13(*b*), circular vias with different diameters (ranging from 95 micrometer to 230 micrometer) were provided. Also meanders with different track widths were provided, as illustrated in FIG. 13(*c*).

Figure 14:
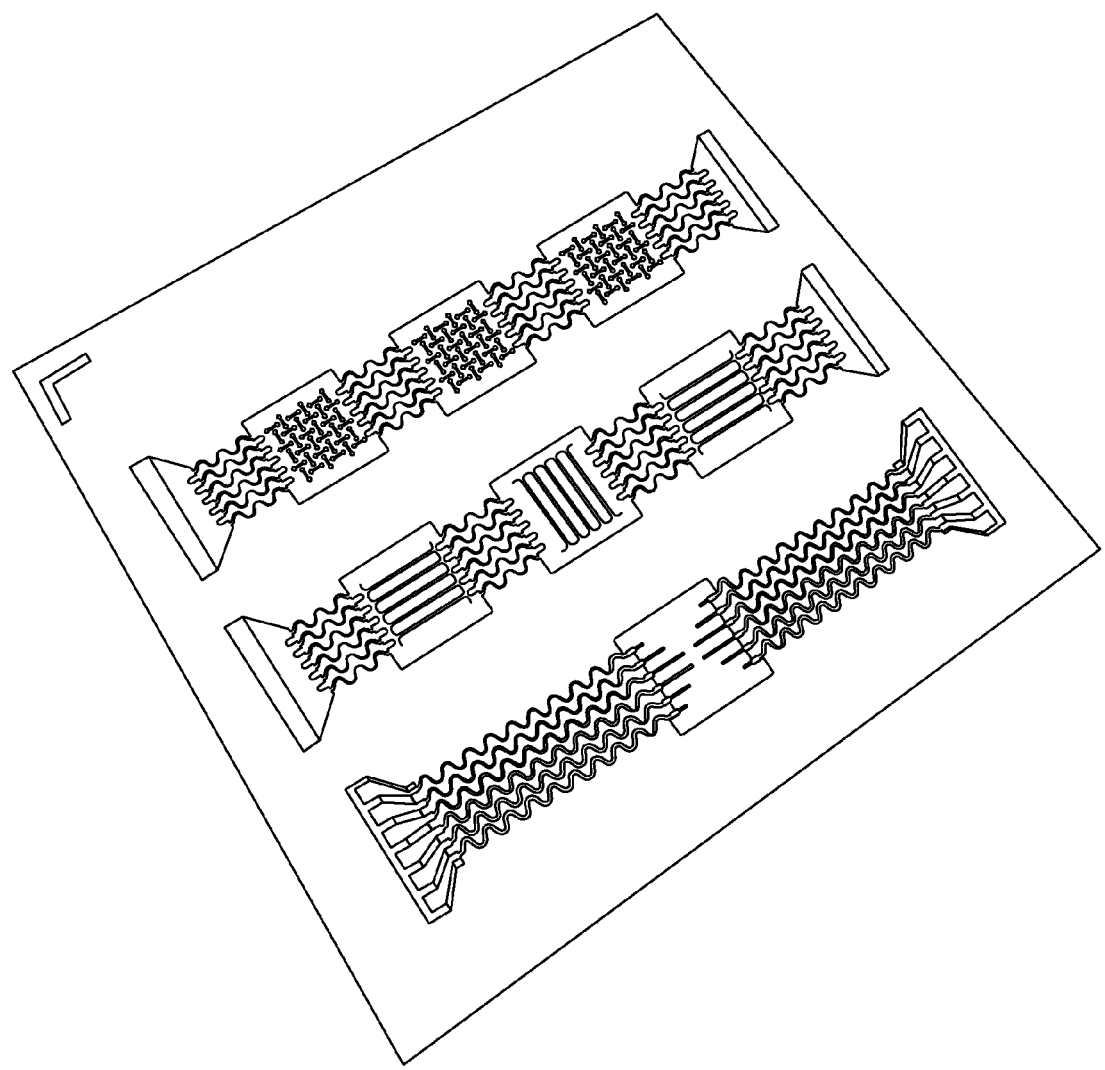
FIG. 14 shows a photograph of a copper foil with a patterned polyimide layer and a screenprinted second conductor layer.

A second patterned conductor layer 200 was then formed by screenprinting Dupont 5025 Polymer Silver conductor and curing during 5 minutes at 120° C. Screenprinting was done using a screen with a stainless steel mesh with a mesh size of 400, angle 45° and an emulsion thickness of 20 micrometer. Curing was done in a convection furnace during 5 minutes at 120° C. The second patterned conductor layer has a sheet resistivity in the order of 8 to 25 mOhm/square/25 micrometer (e.g. a track of 100 micrometer width and 25 micrometer thickness and 10 cm length has a resistance in the order of 8 tot 15 Ohm) and a layer thickness in the range between 7 micrometer and 10 micrometer. A photograph of the structure comprising a patterned second conductor layer is shown in FIG. 14. Tracks and meanders are defined and supported by the flexible supporting layer. The flexible supporting layer also provides isolation between the copper and the second conductor layer.

FIG. 15 shows photographs illustrating the second patterned conductor layer being separated by the flexible supporting layer from the copper sheet and being in contact with the copper sheet through vias. Different linewidths were provided for the second conductor layer, ranging from 61 micrometer to 195 micrometer. Line spacings in the range between 40 micrometer and 155 micrometer were successfully realized.

After providing the second conductor layer, a layer of Quickstick 135 wax (South Bay Technology Inc.) was spin coated at the side where the second conductor layer is present. A Quickstick of 17.5 g was dissolved in 30 ml of acetone and spinning was done during 30 seconds at 1000 rpm. On an etched RO4003 substrate (Rogers Corporation) a same wax layer was provided. This RO4003 substrate is used as a temporary carrier during the different subsequent process steps. Both substrates, i.e. on one hand the structure comprising the copper first conducting layer, the first supporting layer, the silver second conducting layer and the wax layer, and on the other hand the structure comprising the temporary carrier with the wax layer, were then laminated with the wax layers facing each other, thereby forming a temporary carrier—wax layer—silver polymer conductor layer—polyimide layer—copper layer stack.

Figure 16:
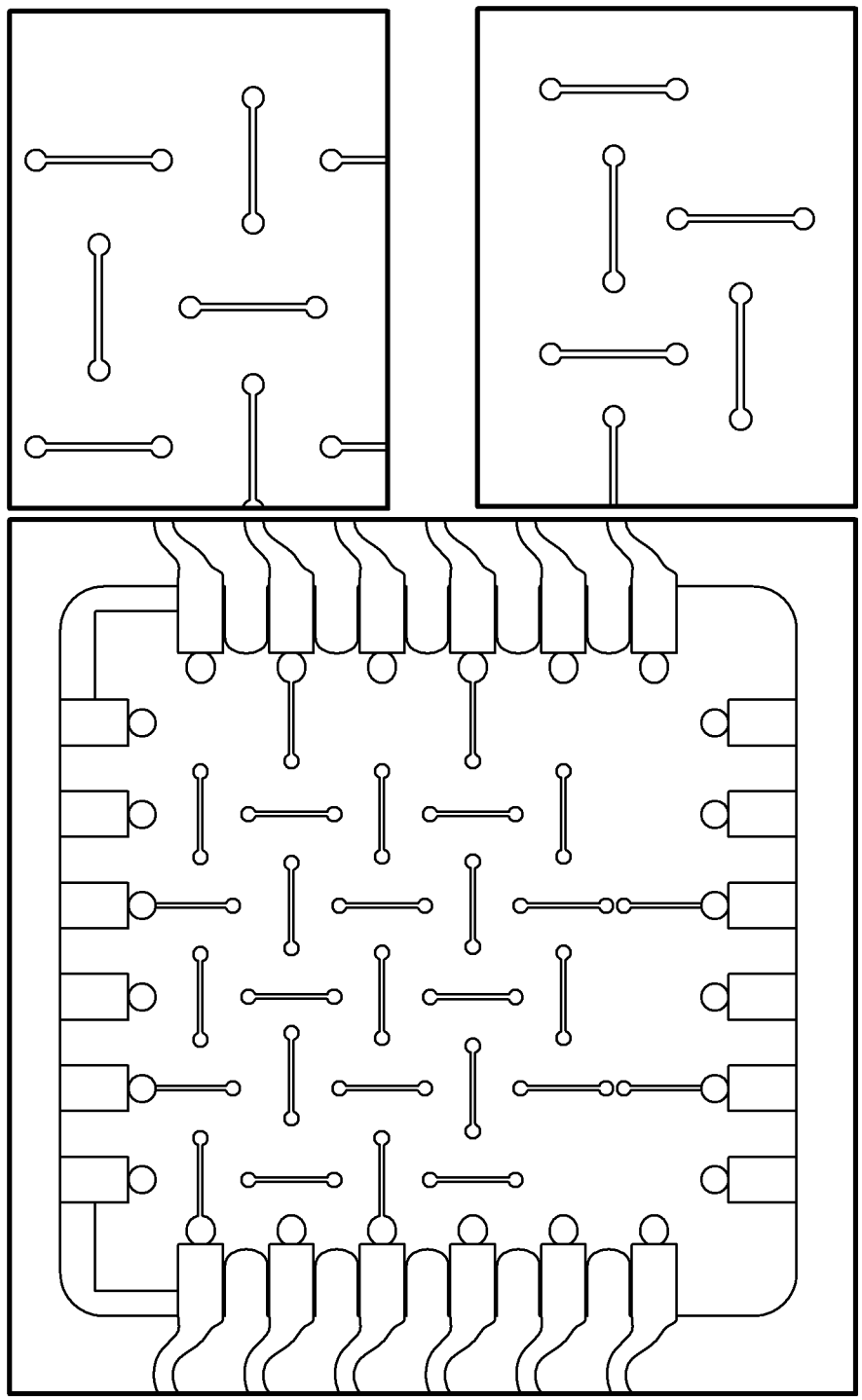
FIG. 16 shows the structure after patterning of the first conductor layer.

After performing the lamination process, the copper layer was patterned. This was done by providing a standard photoresist (AZ4562) pattern, etching the copper in a HCl/CuCl solution and stripping the photoresist in AZ 400K. During this process the silver filled polymer conductor (second conductor layer) is not attacked by the solution because it is protected by the polyimide layer and the wax layer. FIG. 16 shows photographs of the structure after patterning the first conductor layer.

After these processes the circuitry was defined. Soldermask was applied on the stretchable interconnections and the flexible functional islands. In this way a second insulation layer is obtained on top of the stretchable interconnections, leading to a conductor completely surrounded by a flexible support layer. Components were soldered by use of a reflow soldering process.

Next adhesion promoter OS 1200 was applied by spraying. The structure was provided into a mould, in which Sylgard 186 was injected. The Sylgard 186 was cured at 50° C. Next the temporary carrier RO4003 was removed by heating the structure to a temperature of 200° C., which leads to melting of the wax. In this way, the temporary carrier can easily be removed. The remaining wax was removed by means of acetone and water. In a next process an adhesion promoter was applied on the rear side of the structure. A bottom mould was provided and Sylgard 186 was injected into the bottom mould. The assembly was then cured at 50° C. and the resulting device was removed from the mould.

A feasibility study has shown that by using a stainless steel screen as in the experiments described above, tracks of 100 micrometer wide (as designed and defined on the screen) lead to printed silver filled polymer tracks of about 120 micrometer wide. Vias can be made with a diameter down to 100 micrometer in the photdefinable polyimide, assuring an electrical contact between the copper layer at one side of the polyimide and the silver containing layer at the other side of the polyimide. The via landing size dimensions are preferably larger than the defined via dimensions, for compensating overdeveloping of the polyimide. Parallel tracks are preferably defined with a separation of at least 200 micrometer to avoid short circuits.

The foregoing description details certain embodiments of the invention. It will be appreciated, however, that no matter how detailed the foregoing appears in text, the invention may be practiced in many ways. It should be noted that the use of particular terminology when describing certain features or aspects of the invention should not be taken to imply that the terminology is being re-defined herein to be restricted to including any specific characteristics of the features or aspects of the invention with which that terminology is associated.

While the above detailed description has shown, described, and pointed out novel features of the invention as applied to various embodiments, it will be understood that various omissions, substitutions, and changes in the form and details of the device or process illustrated may be made by those skilled in the technology without departing from the spirit of the invention. The scope of the invention is indicated by the appended claims rather than by the foregoing description. All changes which come within the meaning and range of equivalency of the claims are to be embraced within their scope.

What is claimed is:

1. A stretchable electronic device comprising:
a first stretchable interconnection electrically connecting two electronic components of the device, the first stretchable interconnection comprising:
a first electrically conductive channel having a predetermined first geometry by which the channel is stretchable up to a given elastic limit, wherein the first geometry includes a first meandering shape, and
a first patterned flexible supporting layer directly supporting the first electrically conductive channel and having a predetermined second geometry by which the first supporting layer is stretchable, wherein the second geometry includes a second meandering shape,
wherein the predetermined second geometry of the first flexible supporting layer has a first predetermined deviation from the predetermined first geometry of the first electrically conductive channel, the first predetermined deviation being chosen so as to restrict stretchability of the first electrically conductive channel below its elastic limit.

2. The stretchable electronic device according to claim 1, wherein the device further comprises a second stretchable interconnection comprising a second electrically conductive channel crossing the first electrically conductive channel, wherein the first flexible supporting layer is an electrically insulating layer providing an electrical insulation between the first electrically conductive channel and the second electrically conductive channel.

3. The stretchable electronic device according to claim 2, wherein the first electrically conductive channel is formed in a first conductor layer and wherein the second electrically conductive channel is formed partially in the first conductor layer and partially in a second conductor layer.

4. The stretchable electronic device according to claim 3, further comprising vias through the first flexible supporting layer, the vias being configured to provide an electrical contact between the first conductor layer and the second conductor layer.

5. The stretchable electronic device according to claim 2, wherein the second electrically conductive channel has a predetermined third geometry by which the second electrically conductive channel is stretchable up to a given elastic limit, wherein the first flexible supporting layer is provided for supporting the second electrically conductive channel, wherein the first flexible supporting layer has a predetermined fourth geometry by which the first supporting layer is stretchable, wherein the predetermined fourth geometry has a second predetermined deviation from the predetermined third geometry of the second electrically conductive channel, the second predetermined deviation being chosen for restricting the stretchability of the second electrically conductive channel below its elastic limit.

6. The stretchable electronic device according to claim 2, wherein the second predetermined deviation takes the form of an increased width of at least part of the predetermined fourth geometry of the first flexible supporting layer compared to that of the predetermined third geometry of the second electrically conductive channel.

7. The stretchable electronic device according to claim 2, wherein the second predetermined deviation of the predetermined fourth geometry of the first flexible supporting layer is formed at stress sensitive parts of the second electrically conductive channel.

8. The stretchable electronic device according to claim 2, wherein the third predetermined geometry of the second electrically conductive channel is a repeated third meandering shape being defined by a third angle with respect to a 0°-baseline, a third width and a third diameter and in that the fourth predetermined geometry of the first flexible supporting layer is a repeated fourth meandering shape being defined by a fourth angle with respect to a 0°-baseline, a fourth width and a fourth diameter, at least one of the fourth angle, width or diameter differing from respectively the third angle, width or diameter along at least a part of the second stretchable electronic interconnection.

9. The stretchable electronic device according to claim 8, wherein at stress sensitive parts of the meandering shape of the second electrically conductive channel, the fourth width of the meandering shape of the first flexible supporting layer is larger than the third width of the meandering shape of the second electrically conductive channel.

10. The stretchable electronic device according to claim 1, wherein the first predetermined deviation takes the form of an increased width of at least part of the predetermined second geometry of the first flexible supporting layer compared to that of the predetermined first geometry of the first electrically conductive channel.

11. The stretchable electronic device according to claim 1, wherein the first predetermined deviation of the predetermined second geometry of the first flexible supporting layer is formed at stress sensitive parts of the first electrically conductive channel.

12. The stretchable electronic device according to claim 1, wherein the first flexible supporting layer comprises a support part at an end of the first and/or stretchable interconnection for supporting at least one of the electronic components.

13. The stretchable electronic device according to claim 1, wherein the stretchable electronic device comprises a layer of stretchable material in which the stretchable electronic device is embedded.

14. The stretchable electronic device according to claim 1, wherein the first electrically conductive channel and/or the second electrically conductive channel comprises a first layer and a second layer, provided on top of the first layer, the first and the second layer being made of a different first and second electrically conductive material.

15. The stretchable electronic device according to claim 1, wherein the stretchable interconnection comprises a second flexible supporting layer configured to support the first electrically conductive channel and/or the second electrically conductive channel at an opposite side compared to the first flexible supporting layer and having a predetermined fifth geometry by which the second supporting layer is stretchable.

16. The stretchable electronic device according to claim 1, wherein the first predetermined geometry of the first electrically conductive channel is a repeated first meandering shape being defined by a first angle with respect to a 0°-baseline, a first width and a first diameter, and wherein the second predetermined geometry of the first flexible supporting layer is a repeated second meandering shape being defined by a second angle with respect to a 0°-baseline, a second width and a second diameter, at least one of the second angle, width or diameter differing from respectively the first angle, width or diameter along at least a part of the first stretchable electronic interconnection.

17. The stretchable electronic device according to claim 16, wherein at stress sensitive parts of the meandering shape of the first electrically conductive channel, the second width of the meandering shape of the first flexible supporting layer is larger than the first width of the meandering shape of the first electrically conductive channel.

18. A stretchable electronic device comprising:
a stretchable interconnection electrically connecting two electronic components of the device, the stretchable interconnection comprising:
an electrical conductor having a plurality of first curvatures and elastically stretchable in a first direction up to an elastic limit, and
a patterned insulator layer in contact with and directly supporting the electrical conductor, the patterned insulator layer having a plurality of second curvatures,
wherein the electrical conductor and the patterned insulator at least partially overlap each other throughout lengths of the electrical conductor and the patterned insulator, and have deviations between the first curvatures and second curvatures, the deviations restricting the electrical conductor from stretching in the first direction beyond the elastic limit.

19. The stretchable electronic device of claim 18, wherein a second width of the patterned insulator is greater than a first width of the electrical conductor.

20. The stretchable electronic device of claim 18, wherein the patterned insulator has increased widths at locations corresponding to the plurality of first curvatures of the electrical conductor that experience a higher level of stress compared non-curved portions of the electrical conductor when the electrical conductor is stretched.

* * * * *